United States Patent [19]
Grubisich et al.

[11] Patent Number: 5,698,459
[45] Date of Patent: Dec. 16, 1997

[54] FABRICATION OF BIPOLAR TRANSISTORS USING SELECTIVE DOPING TO IMPROVE PERFORMANCE CHARACTERISTICS

[75] Inventors: Michael J. Grubisich, San Jose; Constantin Bulucea, Milpitas, both of Calif.

[73] Assignee: National Semiconductor Corporation, Santa Clara, Calif.

[21] Appl. No.: 456,446

[22] Filed: Jun. 1, 1995

Related U.S. Application Data

[62] Division of Ser. No. 319,759, Oct. 7, 1994.

[51] Int. Cl.$^6$ .................................. H01L 21/265
[52] U.S. Cl. .................. 437/31; 437/162; 437/909; 148/DIG. 10
[58] Field of Search ................ 437/31, 32, 162, 437/909; 148/DIG. 10

[56] References Cited

U.S. PATENT DOCUMENTS

| | | | |
|---|---|---|---|
| 4,946,798 | 8/1990 | Kawakatsu | 257/592 |
| 4,996,581 | 2/1991 | Hamasaki | 437/31 |
| 5,006,476 | 4/1991 | De Jong et al. | 437/31 |
| 5,079,182 | 1/1992 | Ilderem et al. | 437/57 |
| 5,302,535 | 4/1994 | Imai et al. | 257/592 |
| 5,336,926 | 8/1994 | Matthews | 437/31 |
| 5,338,695 | 8/1994 | Ratnam | 437/31 |
| 5,393,677 | 2/1995 | Lien et al. | 437/31 |

OTHER PUBLICATIONS

Philips, *Transistor Engineering* (McGraw-Hill; reprinted: Robert E. Krieger Pub. Co., 1981), 1962, pp. 298–304.
Warner et al, *Transistor Fundamentals for the Integrated-Circuit Engineer* (John Wiley & Sons), 1983, pp. 559–562.
Grove, *Physics and Technology of Semiconductor Devices* (John Wiley & Sons), 1967, pp. 219–222.
Alvarez, *BiCMOS Technology and Applications* (Kluwer Acad. Pub., 2d ed.), 1993, pp. 96–100.
Ratnam et al, "The Effect of Isolation Edge Profile on the Leakage and Breakdown Characteristics of Advanced Bipolar Transistors," IEEE Bipolar Cirs. & Tech. Meeting, 7–8 Oct. 1992, pp. 117–120.
Grove, *Physics and Technology of Semiconductor Devices* (John Wiley and Sons), 1967, pp. 230–234.
Konaka et al, "A 20 ps/G Si Bipolar IC Using Advanced SST with Collector–Ion Implantation,: *Procs. Solid State Devs. & Mats. Conf.,*" 1987, pp. 331–334.
Grove, *Physics and Technology of Semiconductor Devices* (John Wiley and Sons), 1967, pp. 228–230.
Muller et al, *Device Electronics for Integrated Circuits* (John Wiley & Sons), 1977, pp. 241–245.
Iranmanesh et al, "A 0.8μm Advanced Single–Poly BiCMOS Technology for High–Density and High–Performance Applications", *IEEE J. of Solid–State Circs.*, pp. 422–426, Mar. 1991.

*Primary Examiner*—Tuan H. Nguyen
*Attorney, Agent, or Firm*—Skjerven, Morrill, MacPherson, Franklin & Friel; Ronald J. Meetin

[57] ABSTRACT

Parts of the emitter and base of a vertical bipolar transistor adjoin a field-isolation region to form a walled-emitter structure. The transistor is furnished with extra doping in the collector and, optionally, in the base. The extra collector doping is provided along collector-base junction below the intrinsic base to create a special collector zone spaced laterally apart from the field-isolation region. The presence of the special collector zone causes the intrinsic base to be thinner, thereby raising the cutoff frequency and overall current gain. The extra base doping is provided in the intrinsic base along the field-isolation region to improve the transistor's breakdown voltage and leakage current characteristics.

24 Claims, 14 Drawing Sheets

FABRICATION OF BIPOLAR TRANSISTORS USING SELECTIVE DOPING TO IMPROVE PERFORMANCE CHARACTERISTICS

This is a division of U.S. patent application Ser. No. 08/319,759, filed Oct. 7, 1994.

FIELD OF USE

This invention relates to semiconductor devices. More particularly, this invention relates to bipolar transistors, including structures and methods for manufacturing high-frequency bipolar transistors.

BACKGROUND

Bipolar transistors are used in digital applications where the transistors must be capable of switching between different states very rapidly. Bipolar transistors also provide gain in high-frequency analog applications. Accordingly, the transistor cutoff frequency $f_T$ is an important parameter in designing a bipolar transistor for such a high-frequency digital or analog application. Cutoff frequency $f_T$ is the frequency at which the small-signal current gain drops to 1. Another important transistor design parameter is the collector saturation current $I_S$ per unit area.

Reducing transistor size in order to increase the number of bipolar transistors that can be packed in a given lateral area is a common transistor design objective. As the transistor lateral dimensions are scaled down, the vertical dimensions are also often scaled down, with the result that the base becomes thinner. In scaling down the base, both cutoff frequency $f_T$ and collector saturation current $I_S$ normally increase. This is advantageous.

In a simplified one-dimensional analysis, the increase in parameters $f_T$ and $I_S$ with decreasing metallurgical base thickness $t_B$ can be seen from the following equations that apply to a single-emitter npn transistor:

$$f_T = \frac{2.43 \, \alpha_0 D_n}{2\pi (t_{BEFF})^2} \quad (1)$$

$$I_S = \frac{q D_n (n_i)^2}{\int_{t_{BEFF}} N_A(x) \, dx} \quad (2)$$

where:

$\alpha_0$ is the static common-base current gain (nearly 1), $D_n$ is the average electron diffusivity in the base, $t_{BEFF}$ is the effective electrical thickness of the base—i.e., the distance between the boundaries of the emitter-base and collector-base depletion regions, q is the electronic charge, $n_i$ is the intrinsic electron density (approximately $1.4 \times 10^{10}$ electrons/cm$^3$ in silicon at room temperature), $N_A$ is the base (acceptor) dopant concentration, and x is an integrating variable in the base along the direction of main current flow.

Effective base thickness $t_{BEFF}$ decreases as metallurgical base thickness $t_B$—i.e., the distance between the emitter-base and collector-base junctions—decreases. Since $t_{BEFF}$ is in the denominator of Eq. 1, cutoff frequency $f_T$ increases with decreasing $t_{BEFF}$. Use of $t_{BEFF}$ in the dopant integral of Eq. 2 indicates that this integral, commonly referred to as the base Gummel number, is taken across the quasi-neutral region of the base—i.e., the region extending between the two depletion regions. The base Gummel number generally decreases as $t_{BEFF}$, and thus $t_B$, decrease. As a result, collector saturation current $I_S$ increases with decreasing $t_B$.

The collector current $I_C$ per unit area is determined from saturation current $I_S$ according to the following approximate relationship:

$$I_C = I_S \exp(q V_{BE}/KT) \quad (3)$$

where:

$V_{BE}$ is the base-to-emitter voltage, k is Boltzmann's constant, and

T is the absolute temperature.

Since saturation current $I_S$ increases with decreasing base thickness $t_B$, collector current $I_C$ advantageously increases as $t_B$ is down-scaled.

The current gain $\beta$ is also an important factor in designing a high-frequency bipolar transistor. Current gain $\beta$ is defined as $I_C/I_B$ where $I_B$ is the base current per unit area. For highly simplified conditions (i.e., uniform, abrupt-junction dopant profiles with ideal emitter efficiency), current gain $\beta$ is given approximately as:

$$\beta = 2 \left( \frac{L_n}{t_{BEFF}} \right)^2 \quad (4)$$

where $L_n$ is the minority carrier diffusion length in the base. Although Eq. 4 is a rough approximation, it reflects the fact that $\beta$ increases as metallurgical base thickness $t_B$ is reduced. The net result is that parameters $f_T$, $I_S$, $I_C$, and $\beta$ all increase when the base is made thinner.

Eqs. 1–4 are available in prior art semiconductor literature. See: Philips, *Transistor Engineering* (McGraw-Hill; reprinted: Robert E. Krieger Pub. Co., 1981), 1962, pages 298–304; Warner et al, *Transistor Fundamentals for the Integrated-Circuit Engineer* (John Wiley & Sons), 1983, pages 559–562; and Grove, *Physics and Technology of Semiconductor Devices* (John Wiley & Sons), 1967, pages 219–222.

In a vertical bipolar transistor, the emitter adjoins a surface, referred to here as the upper surface, of a semiconductor body. The base consists of an intrinsic part (commonly termed the "intrinsic base") and one or more laterally adjoining extrinsic parts (commonly termed "extrinsic bases"). The intrinsic base lies directly below the emitter. Each extrinsic base includes a heavily doped base contact zone which extends to the upper surface of the semiconductor body and to which electrical contact is made at a location spaced laterally apart from the emitter.

The collector typically includes a lightly to moderately doped main collector region situated directly below the intrinsic base. The collector further includes a heavily doped buried layer that lies below the main collector region and extends laterally beyond the intrinsic base to a heavily doped collector contact zone which typically extends to the upper semiconductor surface to provide electrical access to the collector. Overlying electrical contacts to the emitter and to the contact zones complete the basic transistor. Additionally, a field-isolation region typically surrounds the emitter and base to separate the base from the collector contact zone and from other device elements in the semiconductor body.

The field-isolation region in many high-frequency bipolar transistors is formed with electrically insulating material, typically silicon oxide, whose sidewalls terminate the base. As used here, "terminate" means that the terminated item extends to the item which performs the termination. FIGS. 1a and 1b, which are taken at vertical cross sections perpendicular to each other, illustrate a typical prior art npn transistor whose base is terminated at an oxide-isolation region of the LOCOS type. For example, see Alvarez,

*BiCMOS Technology and Applications* (Kluwer Acad. Pub., 2d ed.), 1993, pages 96–100, in regard to the cross section of FIG. 1a.

The transistor in FIGS. 1a and 1b is fabricated from a semiconductor body consisting of p– silicon substrate 20 and overlying n– silicon epitaxial layer 22. N+ buried collector layer 24 lies along the metallurgical interface between substrate 20 and epitaxial layer 22. Field oxide 26 serves as the oxide-isolation region. N+ emitter 28 is created in a self-aligned manner by out-diffusion from n+ emitter contact 30. The remaining transistor elements are p-base layer 32, a pair of p+ base contact zones 34, n-main collector region 36, and n+ collector contact zone 38. The intrinsic base consists of the portion of base layer 32 underlying emitter 30.

In transistor structures of the foregoing type, the emitter is typically configured as a finger (or stripe) which is terminated at both ends by sidewalls of the field-isolation region. See FIG. 1b. This configuration is referred to here as a "walled-emitter" structure. Walled-emitter transistors are advantageous because they make highly efficient use of the active area. The parasitic collector-base capacitance is quite low for a given active area, thereby improving performance.

Ratnam et al, "The Effect of Isolation Edge Profile on the Leakage and Breakdown Characteristics of Advanced Bipolar Transistors," IEEE Bipolar Cirs. & Tech. Meeting, Oct. 7–8 1992, pages 117–120, deals with walled-emitter bipolar transistors. Ratnam et al observed that the emitter termination regions of a walled-emitter vertical bipolar transistor typically cannot accommodate the same degree of down-scaling as the intrinsic transistor region without adversely affecting the collector-to-emitter leakage current and the collector-to-emitter breakdown voltage of the entire transistor. In particular, the high values of local current gain that can be obtained by vertically down-scaling the intrinsic base are not desirable at the emitter termination regions where two-dimensional doping effects can readily cause premature collector-to-emitter avalanche breakdown to occur.

The influence of the emitter termination regions on collector-to-emitter leakage current and breakdown voltage is difficult to express in simple first-order equations because of the two-dimensional nature of the dopant profiles in the termination regions. Nonetheless, a rough approximation of breakdown voltage $BV_{CEO}$ and the collector-to-emitter leakage current $I_{CEO}$ per unit area can be obtained from the following equations:

$$I_{CEO} = \frac{I_{CBO}}{1 - \left[\frac{\beta/(\beta+1)}{1 - (V_{CE}/BV_{CBO})^n}\right]} \quad (5)$$

$$I_{CBO} = \frac{q\, n_i\, x_{CB}}{2\tau_0} \quad (6)$$

where:

$I_{CBO}$ is the leakage current per unit area of the collector-base junction, $BV_{CBO}$ is the breakdown voltage of the collector-base junction, n, typically in the range of 4–8, is an empirically determined coefficient, $X_{CB}$ is the thickness of the collector-base depletion region at a given value of collector-to-emitter voltage $V_{CE}$, and $\tau_0$ is the carrier generation lifetime in the vicinity of the collector-base junction.

As with Eqs. 1–4, Eqs. 5 and 6 are available in prior art semiconductor literature. See: Grove, cited above, pages 230–234; and Muller et al, *Device Electronics for Integrated Circuits* (John Wiley & Sons), 1977, pages 174–179.

Leakage current $I_{CBO}$ approaches infinity at a value of collector-to-emitter voltage $V_{CE}$ equal to collector-to-emitter breakdown voltage $BV_{CEO}$. Accordingly:

$$BV_{CEO} = \frac{BV_{CBO}}{(\beta+1)^{1/n}} \quad (7)$$

Eqs. 5–7 can be separately applied to the intrinsic and emitter-termination regions of the transistor. Regardless of how accurate Eqs. 5–7 are, they reflect the fact that high local values of current gain β caused by down-scaling the intrinsic base or by two-dimensional doping effects reduce breakdown voltage $BV_{CEO}$ and increase leakage current $I_{CEO}$. Such two-dimensional effects occur in advanced BiCMOS processes where the intrinsic base is doped from overlying polysilicon as observed in Ratham et al, cited above.

Ratnam et al also observed that the two-dimensional doping effects are strongly dependent on the slope of the isolation-oxide sidewalls, especially those having the "bird's beak" shape characteristic of fabrication processes in which the field-isolation region consists primarily of thermally grown silicon oxide. This dependency can be attributed to the combined effects of (a) impurity segregation into the oxide-isolation region and (b) base diffusion blocking by the "bird's beak" portion of the isolation oxide. It would be desirable to reduce current gain β at the emitter termination regions so as to preserve or increase breakdown voltage $BV_{CEO}$ for the entire transistor.

Independent of avalanche-caused collector-to-emitter breakdown, down-scaling of the intrinsic base can cause punch-through to occur at the emitter termination regions. At punch-through, the depletion region of the collector-base junction reaches the depletion region of the emitter-base junction so as to eliminate the normally intervening quasi-neutral base region in which diffusion limits the current flow. The number of electrons passing through the base thereby increases rapidly in a generally undesirable manner as collector-to-emitter voltage $V_{CE}$ is increased. Breakdown voltage $BV_{CEO}$ is again impaired.

Ratnam, U.S. Pat. No. 5,338,695, describes a technique for improving parameters $BV_{CEO}$ and $I_{CEO}$ in a walled-emitter vertical bipolar transistor. The edges of the intrinsic base below the emitter termination regions are selectively provided with additional base dopant, typically by outdiffusion from overlying polysilicon. The thickness of the intrinsic base is thereby increased below the emitter termination regions. This typically produces an increase in breakdown voltage $V_{CEO}$ and a decrease in leakage current $I_{CEO}$. While Ratnam mentions the transistor current gain and the cutoff frequency $f_T$, Ratnam does not actively address improving these parameters.

Konaka et al, "A 20 ps/G Si Bipolar IC Using Advanced SST with Collector Ion Implantation," *Procs. Solid State Devs. & Mats. Conf.*, 1987, pages 331–334, describes a vertical bipolar transistor that utilizes a selective collector implant to improve cutoff frequency. $f_T$ and the maximum collector current density. FIG. 2 illustrates part of the transistor in Konaka et al. The transistor includes p– silicon semiconductor substrate 40, overlying n– epitaxial silicon collector portion 42, buried n+ collector layer 44 along the substrate/epi interface, and field-isolation region 46 of the trench type. N+ polysilicon emitter contact 48 contacts n+ emitter 50 in a self-aligned manner. The transistor further includes p base layer 52, a pair of laterally separated p base contact zones 54, and p+ polysilicon base contact 56.

Konaka et al performs a selective ion implantation to increase the net collector doping below the emitter and intrinsic base. Item 58 in FIG. 2 is the resulting selectively ion-implanted collector ("SIC") zone. The increased collector doping in SIC zone 58 shallows up the base thickness beyond the limits imposed by the base ion-implantation profile. SIC collector zone 58 causes the base push-out (Kirk) effect to occur at a higher value of the collector current density. The maximum collector-current density thus occurs at a greater value of cutoff frequency $f_T$. Metallurgical base thickness $t_B$ decreases as the doping level of collector zone 58 increases. Reducing the base thickness and the base push-out effect thereby improves the cutoff frequency $f_T$ and the maximum collector-current density.

In the cross section of FIG. 2, emitter 50 does not terminate at the sidewalls of field-isolation region 46. Konaka et al does not provide a vertical device cross section perpendicular to the cross section of FIG. 2. Nonetheless, Konaka et al employs a double-polysilicon self-aligned fabrication process which is generally understood to produce bipolar transistors whose emitters do not terminate at the isolation-oxide sidewalls. Although Konaka et al can improve cutoff frequency $f_T$, their utilization of the active transistor area is relatively inefficient. It is desirable to have a bipolar transistor that efficiently utilizes the active area while improving cutoff frequency $f_T$, the overall transistor current gain, breakdown voltage $BV_{CEO}$, and leakage current $I_{CEO}$.

GENERAL DISCLOSURE OF THE INVENTION

The present invention utilizes selective doping to increase the cutoff frequency and current gain of a vertical bipolar transistor suitable for high-frequency operation. The present transistor is of the walled-emitter type in that the emitter and underlying portion of the base adjoin a field-isolation region. The selective doping of the invention is provided in the collector and, optionally, in one or more parts of the base. When the base is selectively doped according to the invention, the collector-to-emitter leakage current and collector-to-emitter breakdown voltage are typically improved without adversely affecting other transistor performance characteristics.

The bipolar transistor of the invention is provided with an emitter, collector, and intervening base situated in a vertical arrangement in a semiconductor body. The emitter overlies an intrinsic portion of the base. The emitter and base are situated in a semiconductor device region. The field-isolation region, typically formed with electrically insulating material such as semiconductor oxide, laterally surrounds the semiconductor device region and is sunk into the semiconductor body along its upper surface. Parts of the emitter and the intrinsic portion of the base adjoin the field-isolation region, typically along a pair of laterally separated opposing internal sidewalls of the field-isolation region. The emitter parts which adjoin the field-isolation region constitute a pair of emitter-termination regions.

A main region of the collector forms a collector-base junction with the base. The main collector region includes a special collector zone situated along the collector-base junction in the semiconductor device region below the intrinsic base portion. The special collector zone has a greater net doping than directly underlying material of the collector.

The presence of the special collector zone causes the intrinsic base portion to be thinner, thereby raising the cutoff frequency and overall current gain. At the same time, the usage of active area is very efficient because the transistor is a walled-emitter device. In addition to a low parasitic collector-base capacitance, the walled-emitter nature of the present transistor enables the first level of interconnection to be done with doped polycrystalline semiconductor material so as to increase device packing density.

Importantly, the special collector zone is spaced laterally apart from the field-isolation region. Accordingly, the special collector zone is laterally separated from the emitter termination regions along the field-isolation region. The lateral separation of the special collector zone from the emitter termination regions provides a degree of freedom in controlling the transistor characteristics. In particular, a design margin is provided for adjusting the base doping to improve the leakage current and breakdown voltage characteristics of the emitter termination regions.

Additional doping of the base is preferably done in semiconductor material situated below one or both emitter termination regions. The intrinsic base portion then constitutes a main intrinsic base segment and one or two side intrinsic base segments continuous with the main intrinsic base segment. Each side intrinsic base segment has a greater net doping, and/or a greater minimum base thickness, than the main intrinsic base segment. The doping of each side intrinsic base segment can be readily adjusted to substantially avoid premature avalanche charge multiplication and punch-through at that side intrinsic base segment.

In particular, increasing the doping at the longitudinal sides of the base below the emitter termination regions causes the portions of the collector-base junction along the longitudinal sides of the base to move further down into the device region, thus increasing both the metallurgical base thickness and the effective base thickness at the longitudinal sides. Also, the increased doping at the longitudinal sides of the base reduces the minority carrier diffusion length there under forward bias. This causes increased recombination of charge carriers to occur at the longitudinal sides of the base.

Due to the preceding effects, the local current gain is reduced at the longitudinal sides of the base below the emitter termination regions. Likewise, the local collector-to-emitter breakdown voltage is increased at the longitudinal sides of the base, thereby raising the overall collector-to-emitter breakdown voltage to at least the level of the intrinsic portion of the transistor. The overall collector-to-emitter leakage current is simultaneously reduced.

The selective doping of the intrinsic base at each side intrinsic base segment is decoupled from the selective doping used to create the special collector zone. Accordingly, the characteristics of the side intrinsic base segments can be optimized according to the details of the isolation and impurity profiles in the vicinity of the field-isolation region.

In manufacturing the present bipolar transistor, the following steps are performed on a semiconductor body provided with a patterned field-isolation region sunk into the body along its upper surface so as to laterally surround a semiconductor device region. A primary base dopant is introduced into the device region to define a base layer. An emitter dopant is selectively introduced generally shallower into the device region than the primary dopant to define the emitter in part of the base layer. A collector dopant is selectively introduced, typically by ion implantation, generally deeper into the device region than the primary dopant to define the special collector zone. The three doping steps can be initiated in various orders. The emitter and collector dopants are of a first conductivity type, while the base dopant is of a second conductivity type opposite to the first conductivity type.

Each side intrinsic base segment is formed by selectively introducing an additional base dopant into the device region through an upper surface portion that overlies part of the intrinsic base portion and extends to the field-isolation region. This doping is performed as a separate step from the doping typically employed to form a heavily doped contact zone for the base. Furthermore, the doping utilized to form the side intrinsic base segments is preferably done by ion implantation. Consequently, the spatial resolution is greater than that which would occur if the doping were done by out-diffusion from overlying material such as polysilicon.

The present invention is especially useful where the sidewalls of the field-isolation region are highly sloped. The implant energy for the ions that form the side intrinsic base segments can be set at a level sufficiently high that the ions pass through the upper ends of the field-isolation region—e.g., the top of the "bird's beak" in the LOCOS structure—and into the underlying semiconductor material. The leakage current and breakdown voltage characteristics at the slanted sidewalls are improved without having to perform additional processing to make the sidewalls more vertical. The net result is that the invention provides a significantly better bipolar transistor than that attainable in the prior art.

BRIEF DESCRIPTION OF THE DRAWINGS

FIGS. 1a and 1b are cross-sectional transverse (front) and longitudinal (side) views of a prior art vertical bipolar transistor. The cross section of FIG. 1a is taken through plane 1a—1a in FIG. 1b. The cross section of FIG. 1b is taken through plane 1b—1b in FIG. 1a.

Like reference symbols are employed in the drawings and in the description of the preferred embodiments to represent the same or very similar item or items.

DESCRIPTION OF THE PREFERRED EMBODIMENTS

Figure 1A:
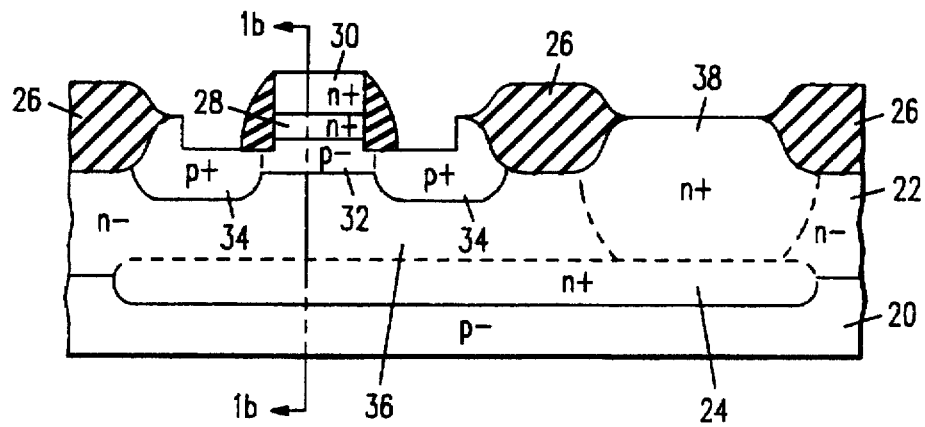
Figure 1B:
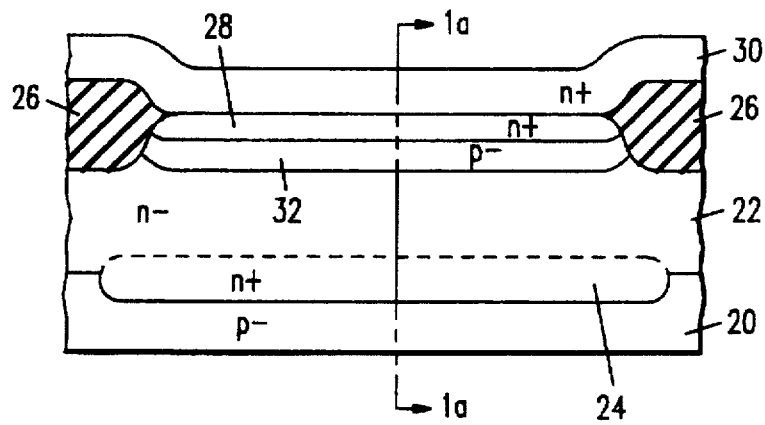
Figure 2:
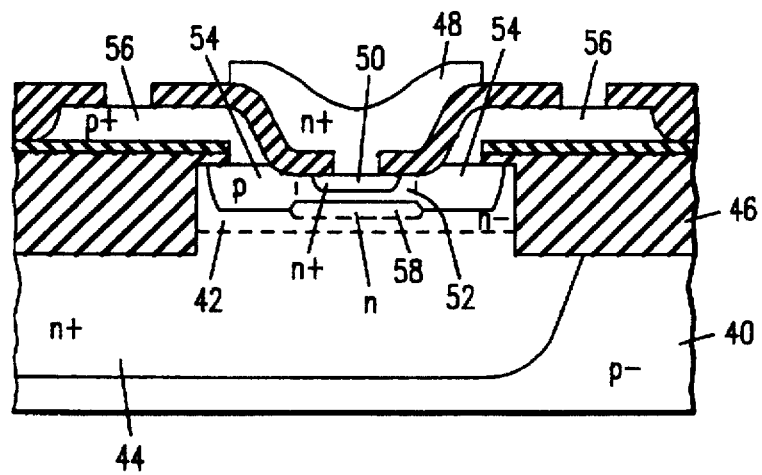
FIG. 2 is a cross-sectional view of another prior art vertical bipolar transistor.
Figure 3A:
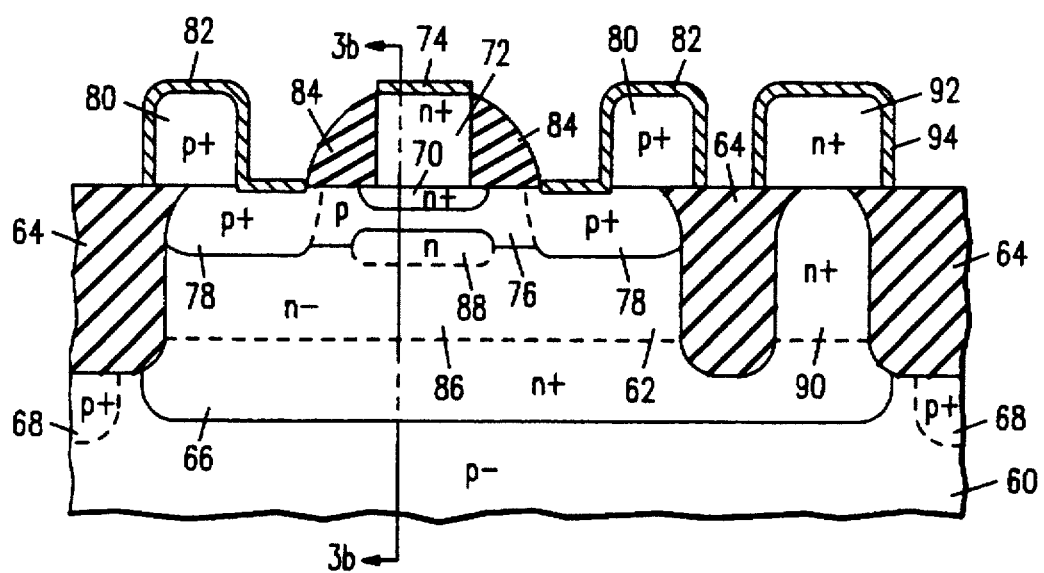
FIGS. 3a and 3b are cross-sectional transverse and longitudinal views of a walled-emitter vertical bipolar transistor provided with special collector doping in accordance with the invention.
Figure 3B:
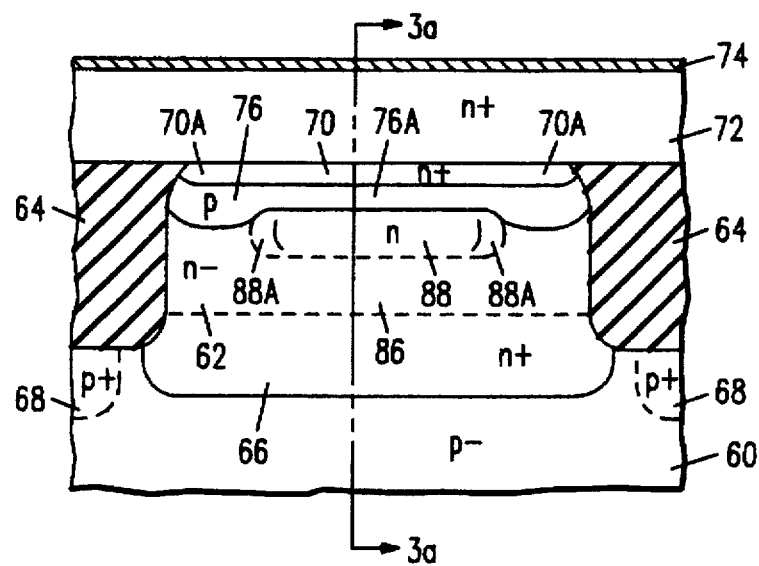
Figure 4:
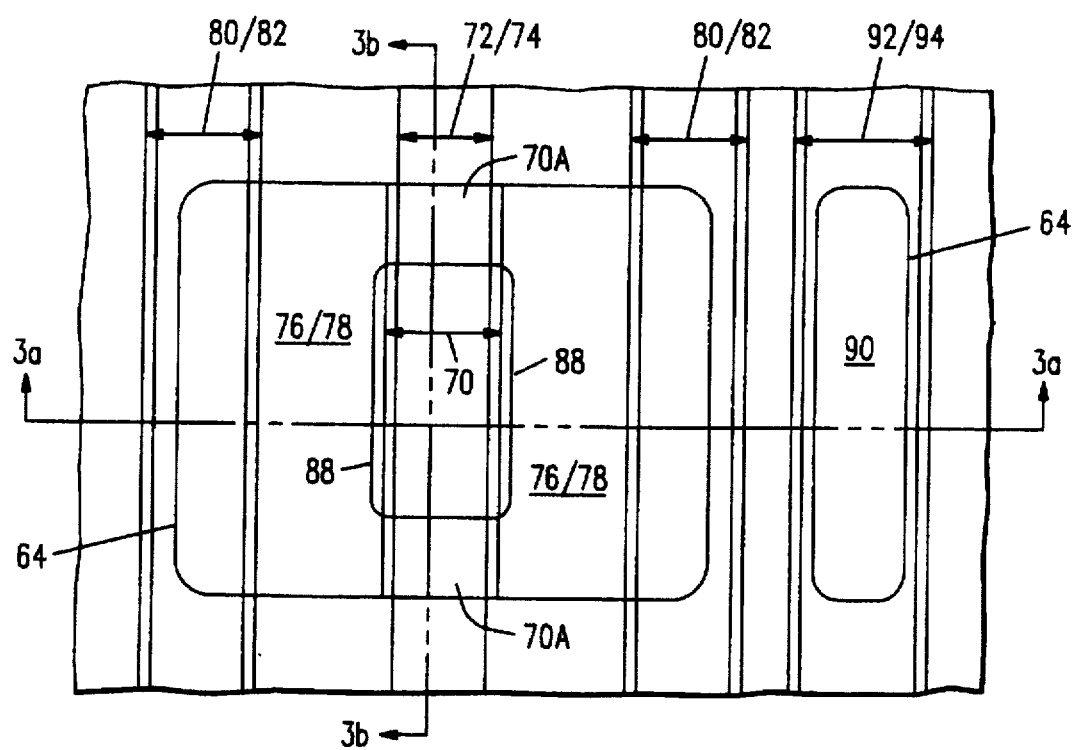
FIG. 4 is a partial layout view of the transistor in FIGS. 3a and 3b. The cross section of FIG. 3a is taken through plane 3a—3a in FIGS. 3b and 4. The cross section of FIG. 3b is taken through plane 3b—3b in FIGS. 3a and 4.

FIGS. 3a and 3b illustrate a walled-emitter npn transistor configured according to the teachings of the invention. FIG. 4 shows a layout for the transistor in FIGS. 3a and 3b. The transistor of FIGS. 3a, 3b, and 4 (collectively "FIGS. 3–4") has an emitter, a collector, and an intervening base. As described further below, the collector is provided with increased doping along part of the collector-base junction so as to increase the cutoff frequency $f_T$ and the collector saturation current $I_S$ per unit area. The collector current $I_C$ per unit area and the overall transistor current gain are thereby increased. Furthermore, the collector doping is provided in such a way as to enable the transistor's overall breakdown voltage and leakage current characteristics to be improved. The transistor is suitable for high-frequency digital and analog applications.

The npn transistor in FIGS. 3–4 is created from a semiconductor body consisting of a (100) lightly doped p-type monocrystalline silicon substrate 60 and an overlying lightly doped n-type epitaxial silicon layer 62. P– substrate 60 typically has a net dopant concentration of $1 \times 10^{15}$ atoms/$cm^3$. N– epitaxial layer 62 typically has a net dopant concentration of $1 \times 10^{16}$ atoms/$cm^3$. The thickness of epitaxial layer 62 typically is 1.1 μm.

A patterned electrically insulating field region 64 of silicon oxide is sunk into the semiconductor body along the upper surface of n– epitaxial layer 62. Field-oxide region 64 extends fully through epitaxial layer 62 and slightly into p– substrate 60 to divide epitaxial layer 62 into a group of laterally separated semiconductor device regions. Two such device regions are shown in FIG. 3a. The lateral dimension of the portion of field oxide 64 lying between these two device regions is not drawn to scale in FIGS. 3a and 4. Alternatively, field-oxide region 64 could extend only partway through epitaxial layer 62. An upper portion of layer 62 would then be divided into a group of laterally separated semiconductor device regions such as the two depicted in FIG. 3a.

For ease in illustration, the sidewalls of oxide-isolation region 64 have been represented in FIGS. 3a and 3b as extending generally vertical with a slight curving at the upper edges. Nonetheless, the isolation-oxide sidewalls can be curved much more drastically than shown in FIGS. 3a and 3b. In fact, as discussed below, the invention is particularly useful in applications where the upper edges of field-isolation region 34 generally have the "bird's beak" profile characteristic of thermally grown silicon oxide.

A heavily doped n-type buried collector layer 66 situated along the metallurgical interface between substrate 60 and epitaxial layer 62 electrically interconnects the two semiconductor device regions in FIG. 3a. Buried n+ layer 66 typically has a maximum net dopant concentration of $2 \times 10^{19}$ atoms/cm$^3$. An annular heavily doped p-type buried channel-stop region 68 also lies along the metallurgical interface between substrate 60 and layer 62. P+ channel-stop region 68 laterally surrounds n+ collector layer 66 and extends upward to meet field-oxide region 64. The maximum net dopant concentration in channel stop 68 typically is $8 \times 10^{17}$ atoms/cm$^3$.

The transistor's emitter is a heavily doped n-type zone 70 situated in the left-hand device region (FIG. 3a) along the upper surface of the semiconductor body. The maximum net dopant concentration in N+ emitter 70 occurs at the upper semiconductor surface and typically is $1 \times 10^{20}$ atoms/cm$^3$. Emitter 70 typically extends to a depth of 0.07 μm into epitaxial layer 62.

FIGS. 3-4 shows that, as viewed in a direction generally perpendicular to the upper semiconductor surface, emitter 70 is in the shape of a finger. Both ends of emitter finger 70 adjoin the sidewalls of oxide-isolation region 64 in the longitudinal direction. See FIG. 3b. Items 70A are the two emitter termination regions at the ends of emitter finger 70.

An overlying heavily doped n-type polysilicon emitter contact 72 contacts emitter 70 in a self-aligned manner. N+ emitter contact 72 is covered with a thin metal silicide cap 74.

The base of the transistor consists of a moderately doped p-type intrinsic base layer 76 and a pair of heavily doped p-type base contact zones 78 located on opposite sides of emitter 70. The combination of p base layer 76 and p+ base contact zones 78 extends fully across the left-hand semiconductor device region in FIG. 3a to adjoin the sidewalls of field oxide 64 in the transverse direction. Base layer 76 also adjoins field oxide 64 in the longitudinal direction as shown in FIG. 3b. The maximum net dopant concentration in base layer 76 occurs at the upper semiconductor surface at a value in the range of $1 \times 10^{17} - 5331 0^{18}$ atoms/cm$^3$, typically $1 \times 10^{18}$ atoms/cm3. P+ base contact zones 78 typically reach a maximum net dopant concentration of $1 \times 10^{19}$ atoms/cm$^3$.

Components 76 and 78 are divided into an intrinsic base and a pair of extrinsic bases situated symmetrically on opposite sides of the intrinsic base. The portion of p base layer 76 located directed below emitter 70 constitutes the intrinsic base. Its thickness typically is 0.1 μm. Each extrinsic base consists of one base contact zone 78 in combination with the adjoining part of base layer 76 outside the intrinsic base.

Each base contact zone 78 contacts an overlying heavily doped p-type polysilicon base contact 80. In the illustrated example, parts of p base layer 76 situated in the extrinsic bases also make contact with p+ base contact 80. A thin metal silicide cap 82 extends from contact zone 78 to base contact 80 to reduce the base resistance. Although not shown in FIG. 4, base contact 80 and cap 82 are typically in the shape of a "U" that extends from one of the extrinsic bases to the other.

A pair of electrically insulating spacers 84 consisting of silicon oxide are situated along the sidewalls of polysilicon emitter contact 72. Oxide sidewall spacers 84 laterally separate metal silicide cap 82 from emitter contact 72 and metal silicide cap 74 so as to avoid short circuiting the base to emitter 70.

The transistor's collector includes a main collector region formed with the epitaxial material situated between n+ buried layer 66 and p base layer 76. The main collector region consists of a lightly doped n-type epitaxial portion 86 and a moderately doped n-type special collector zone 88 situated along the collector-base junction. The maximum net dopant concentration in n special collector zone 88 is in the range of $1 \times 10^{16} - 5 \times 10^{17}$ atoms/cm$^3$, typically $7 \times 10^{16}$ atoms/cm$^3$.

Special collector zone 88 lies below the intrinsic base and emitter 70. However, as shown in FIG. 4, collector zone 88 is in the shape of a rectangle spaced laterally apart from the sidewalls of field oxide 64 in both the transverse (FIG. 3a) and longitudinal (FIG. 3b) directions. Collector zone 88 is thus a "non-walled" region. For an emitter length of 1.2-2.4 μm, typically 1.6 μm, the distance between field oxide 64 and each nearest end of collector zone 88 in the longitudinal direction (FIG. 3b) is 0.2-0.6 μm, typically 0.4 μm.

The collector also includes n+ buried layer 66 and a heavily doped n-type collector contact region 90 that provides buried layer 66 with an electrical path to the upper semiconductor surface through the right-hand semiconductor device region in FIG. 3a. An overlying very heavily doped n-type polysilicon collector contact 92 covered with a thin metal silicide cap 94 contacts n+ collector contact 90 to complete the transistor structure.

During transistor operation, electrons in emitter 70 move generally downward through the intrinsic base, special collector zone 88, and epitaxial portion 86 to buried layer 66. The electrons then flow laterally along buried layer 66 to collector contact zone 90 from where the electrons move upward to the upper semiconductor surface.

Special collector zone 88 provides the transistor of FIGS. 3-4 with improved performance characteristics. In particular, the central part of the intrinsic transistor—i.e., the part encompassed by the vertical projection (both upward and downward) of collector zone 88—has higher values of cutoff frequency $f_T$ and overall current gain then an otherwise similar transistor that lacks collector zone 88. This occurs because the additional doping along the collector-base junction causes metallurgical base thickness $t_B$ to be reduced. Since effective electrical base thickness $t_{BEFF}$ (between the depletion regions of the collector-base and emitter-base junctions) is thereby also reduced, cutoff frequency $f_T$ and saturation current $I_S$ per unit area increase, consistent with Eqs. 1 and 2. In accordance with Eqs. 3 and 4, collector current $I_C$ per unit area and the overall current gain of the transistor likewise increase.

Inasmuch as special collector zone 88 is spaced apart from the sidewalls of field oxide 64 at the ends of emitter finger 70, the presence of collector zone 88 has little effect on the transistor characteristics at emitter termination regions 70A along the sidewalls of field oxide 64. Higher doping levels can then be utilized in the transistor, particularly in the portions of the intrinsic base below emitter termination regions 70A, so as to increase collector-to-emitter breakdown voltage $BV_{CEO}$ and reduce collector-to-emitter leakage current $I_{CEO}$.

In fabricating the transistor, lateral diffusion of the dopant utilized to create special collector zone 88 results in a pair of transition regions in which the dopant concentration gradually decreases from the moderate level of n collector zone 88 to the low level of n− epitaxial portion 86. These transition regions are indicated as items 88A in FIG. 3b. N-type transition region 88A produces local variations in the transistor performance along the emitter length. Nonetheless, the dopant levels and other parameters of the transistor in FIGS. 3-4 are settable at values such that the composite performance in terms of parameters $f_T$, $I_S$, $I_C$, $BV_{CEO}$, and $I_{CEO}$ and the overall current gain is better than in an otherwise similar prior art transistor that lacks special collector zone 88.

Figure 5A:
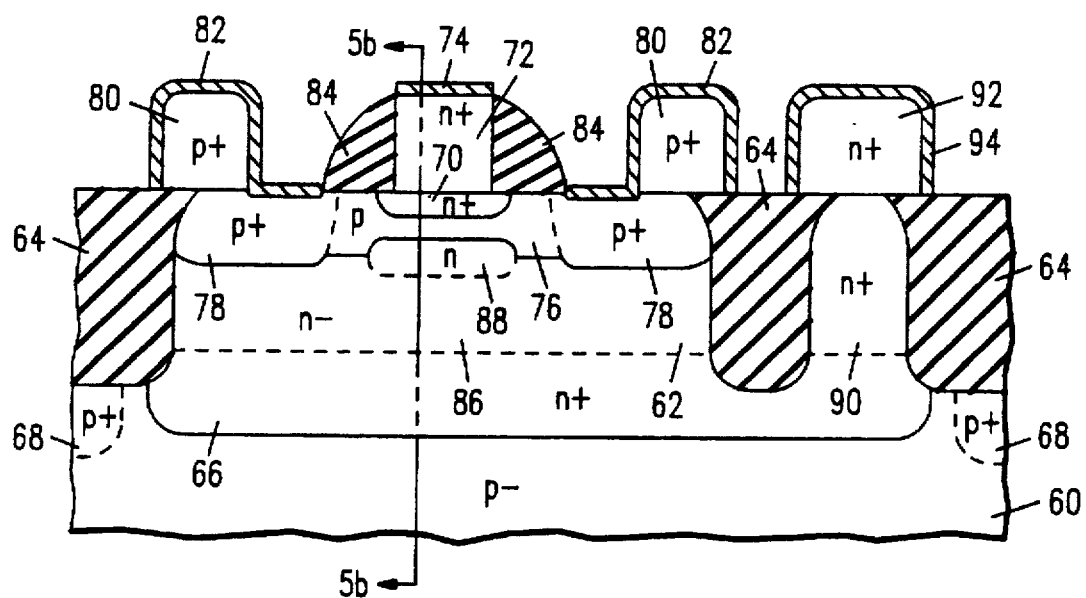
FIGS. 5a and 5b are cross-sectional transverse and longitudinal views of a walled-emitter bipolar transistor provided with special collector doping and base side doping in accordance with the invention.
Figure 5B:
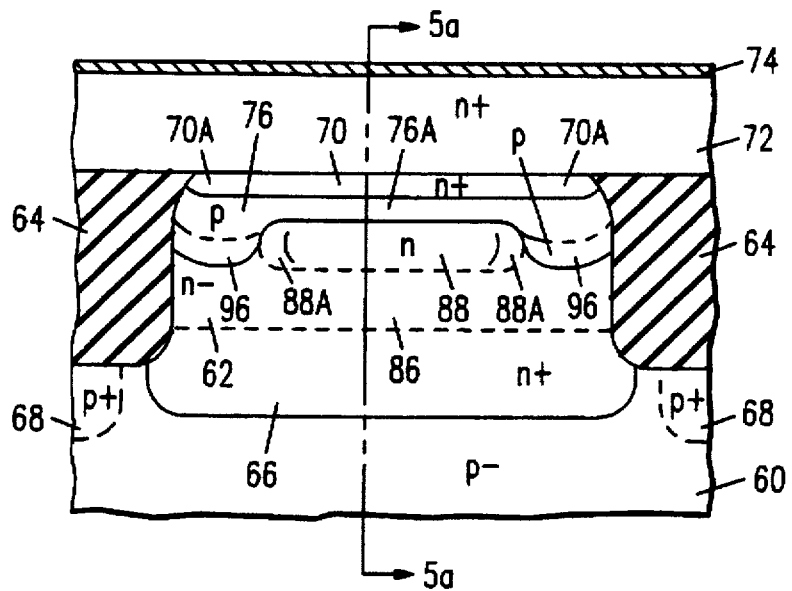
Figure 6:
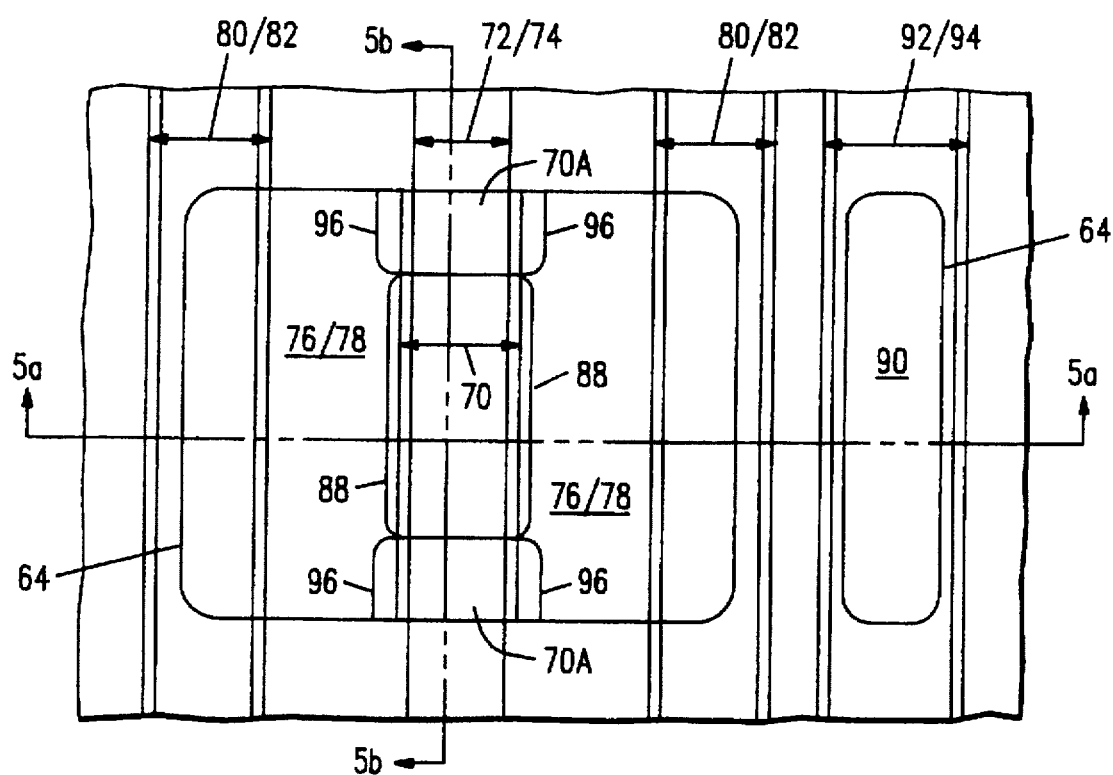
FIG. 6 is a partial layout view of the transistor in FIGS. 5a and 5b. The cross section of FIG. 5a is taken through plane 5a—5a in FIGS. 5b and 6. The cross section of FIG. 5b is taken through plane 5b—5b in FIGS. 5a and 6.

FIGS. 5a and 5b illustrate another walled-emitter vertical npn transistor configured in accordance with the invention. FIG. 6 presents a layout for the transistor in FIG. 5. The transistor in FIGS. 5a, 5b, and 6 (collectively "FIGS. 5–6") utilizes increased collector doping along part of the collector-base junction in combination with additional base doping below emitter termination regions 70A to increase cutoff frequency $f_T$, saturation current $I_S$, and breakdown voltage $BV_{CEO}$ and to decrease leakage current $I_{CEO}$. Collector current $I_C$ and the overall current gain are also raised. As with the transistor of FIGS. 3–4, the transistor of FIGS. 5–6 is well suited for high-frequency digital or analog usage.

The npn transistor of FIGS. 5–6 contains all the elements of the transistor in FIGS. 3–4. This includes n special collector zone 88 fully spaced apart from the sidewalls of oxide-isolation region 64. In addition, the intrinsic base portion of the transistor in FIGS. 5–6 contains a pair of moderately doped side intrinsic base segments 96. See FIGS. 5b and 6. Side intrinsic base segments 96 have a somewhat greater p-type doping, and/or a greater minimum base thickness, than the remaining central moderately doped main segment 76A of p base layer 76.

P side intrinsic base segments 96 adjoin the sidewalls of field oxide 64 at both ends of the intrinsic base portion. As indicated in FIG. 5b, side intrinsic base segments 96 typically extend somewhat deeper into the epitaxial material than the main intrinsic base segment 76A. Accordingly, special collector zone 88 generally lies between side intrinsic base segments 96. The dimension of each side intrinsic base segment 96 in the longitudinal direction (FIG. 5b) is 0.2–0.6 μm, typically 0.4 μm. Segments 96 are typically slightly wider than emitter 70 as indicated in FIG. 6. The maximum net dopant concentration segments 96 occurs at or near the bottom of emitter 70 at a value in the range of $1 \times 10^{17}$–$5 \times 10^{18}$ atoms/cm$^3$, typically $1 \times 10^{18}$ atoms/cm$^3$.

Side intrinsic base segments 96 enhance the base doping to increase base thickness $t_B$ at the longitudinal ends of base layer 76 where, in prior art devices that lack segments 96, thickness $t_B$ has sometimes been unduly small as to subject the base to punch-through or premature avalanching at the longitudinal ends. The increased base doping and thickness at the longitudinal ends of base layer 76 increases the value of collector-to-emitter voltage $V_{CE}$ needed to cause punch-through at the longitudinal ends. Per Eq. 2, saturation current $I_S$ is also reduced at the longitudinal ends of base layer 76 below emitter termination regions 70A. Increased base doping also reduces the minority carrier diffusion length $L_n$, thereby leading to increased charge-carrier recombination. These effects reduce local current gain β at the longitudinal ends of base layer 76 in accordance with Eq. 4 and stop premature avalanching.

Per Eq. 7, collector-to-emitter breakdown voltage $BV_{CEO}$ is increased at the longitudinal sides of base layer 76 along the sidewalls of field-isolation region 64. Accordingly, breakdown voltage $BV_{CEO}$ is increased for the transistor as a whole. Collector-to-emitter leakage current $I_{CEO}$ for the transistor is simultaneously decreased. The presence of side intrinsic base segments 96 thereby improves parameters $BV_{CEO}$ and $I_{CEO}$.

Special collector zone 88 is functionally decoupled from side intrinsic base segments 96. Collector zone 88 thus causes parameters $f_T$ and the overall transistor current gain to be increased in the manner described above. Importantly, base segments 96 adjoin collector zone 88 so as to limit the size of zone 88 in the longitudinal direction. This prevents collector zone 88 from expanding longitudinally in a manner that could degrade the transistor's breakdown voltage and leakage current characteristics. Special collector zone 88 also limits the lateral diffusion of base segments 96 into the central transistor which could degrade performance characteristics. In short, the combination of collector zone 88 and side intrinsic base segments 96 provides a substantial improvement in transistor performance.

FIGS. 7A–7H (collectively "FIG. 7") and FIGS. 8A–8C (collectively "FIG. 8") illustrate a process for manufacturing the vertical npn transistor of FIGS. 5–6 in accordance with the invention. To fabricate the vertical npn transistor of FIGS. 3–4 in accordance with the invention, the step involving the formation of side intrinsic base segments 96 is deleted from the process of FIGS. 7 and 8. Similarly, a vertical npn transistor having side segments 96 but not special collector zone 88 is manufactured in accordance with the invention by deleting the step involved in creating collector zone 88 from the process of FIGS. 7 and 8.

The process of FIGS. 7 and 8 is typically a modification of a BiCMOS fabrication process such as that described in Ilderem et al, U.S. Pat. No. 5,079,182. Accordingly, n-channel and p-channel insulated-gate field-effect transistors are typically formed as part of an integrated circuit that contains the bipolar transistor of FIGS. 5–6. For simplicity, FIGS. 7 and 8 and the accompanying process description do not deal with the fabrication of any transistors except that of FIGS. 5–6.

The n-type dopings in the fabrication process are performed with antimony, arsenic, and/or phosphorus. The p-type dopings are done with boron.

Figure 7A:
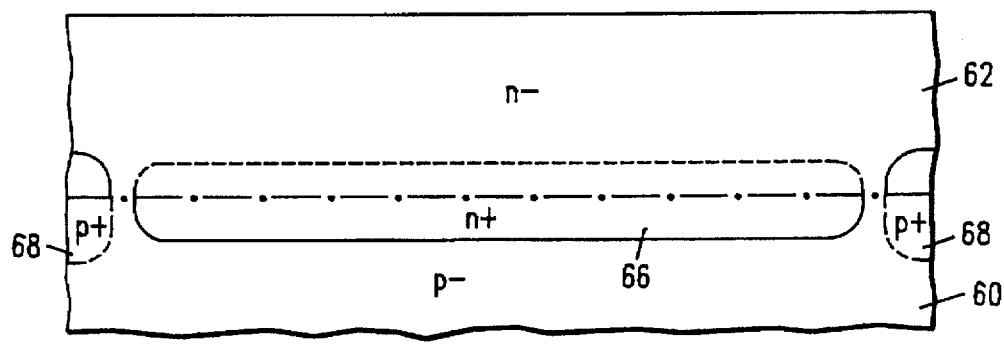
FIGS. 7A–7H are cross-sectional transverse views representing steps in a process for manufacturing the transistor of FIGS. 5a, 5b, and 6 in accordance with the invention.

The starting point is p− substrate 60. Using suitable photoresist masks, n-type and p-type dopants are introduced at high dosages into substrate 60 at the locations for n+ buried layer 66 and p+ channel stop 68. N− epitaxial layer 62 is grown on substrate 60. During the epitaxial growth, part of the n-type and p-type dopants introduced into substrate 60 updiffuse to produce buried layer 66 and channel stop 68 along the metallurgical interface between substrate 60 and epitaxial layer 62 as shown in FIG. 7A.

Figure 7B:
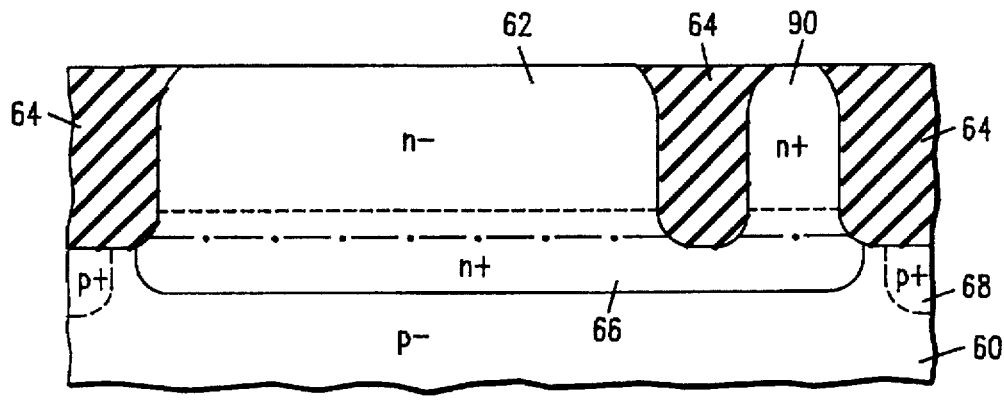

Field-oxide region 64 is formed along the upper semiconductor surface according to a conventional thermal-oxidation technique. Using a photoresist mask (not shown), an n-type dopant is introduced at a high dosage into the right-hand semiconductor device region. The n− epitaxial material in the right-hand device region thereby becomes n+ collector contact zone 90. FIG. 7B shows the structure at this stage.

Figure 7C:
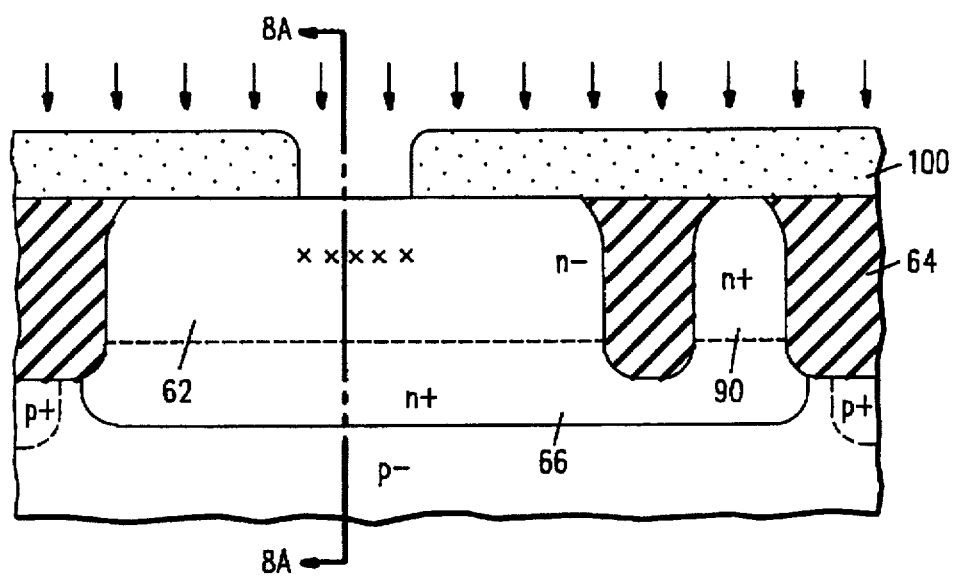
Figure 7D:
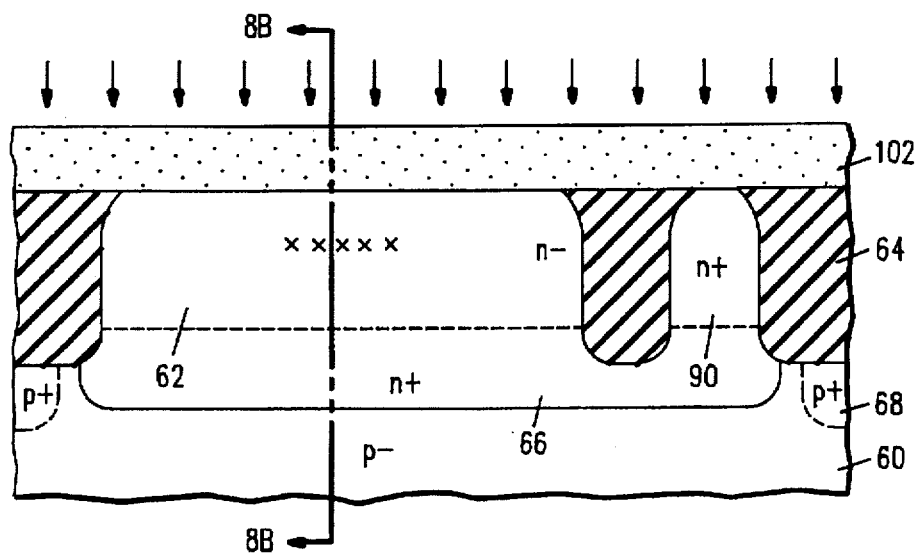
Figure 8A:
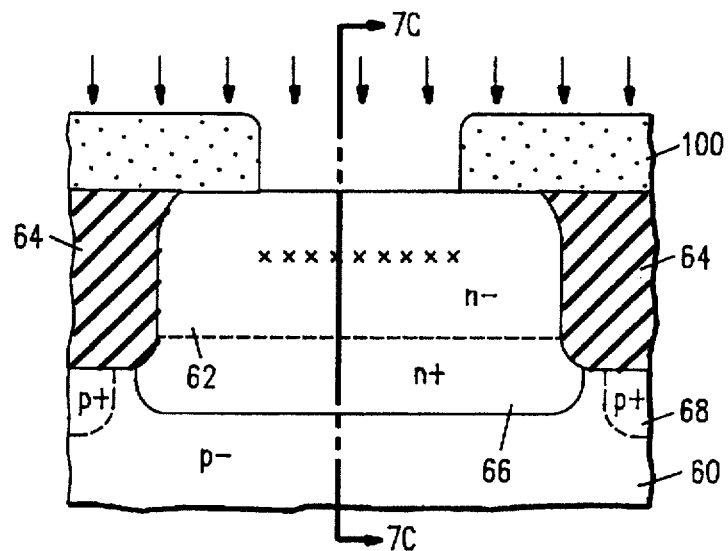
FIGS. 8A–8C are cross-sectional longitudinal views respectively corresponding to FIGS. 7C–7E. The cross sections of FIGS. 7C–7E are taken respectively through planes 7C–7E, 7D—7D, and 7E—7E in FIGS. 8A–8C. The cross sections of FIGS. 8A–8C are taken respectively through planes 8A—8A, 8B—8B, and 8C—8C in FIGS. 7C–7E.
Figure 8B:
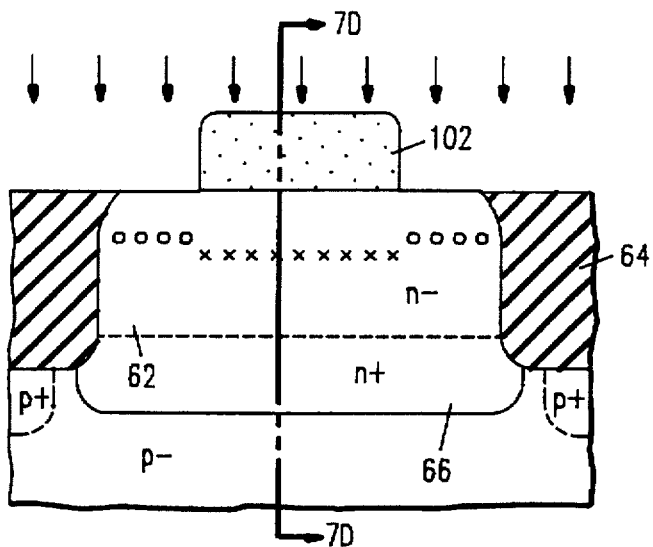

Using a photoresist mask 100, an n-type dopant is selectively ion implanted at a moderate dosage into n-epitaxial layer 62 at the general location for special collector zone 88 as shown in FIGS. 7C and 8A. The small "xs" in FIGS. 7C and 8A indicate the approximate location of the mean depth of the implanted dopant. The n-type dopant is typically phosphorus at a dosage of $4 \times 10^{12}$ ions/cm$^2$. The implant energy is 80–180 KeV, typically 150 KeV. Photoresist 100 is subsequently removed.

Using another photoresist mask 102, a p-type dopant is selectively ion implanted at a moderate dosage into n-epitaxial layer 62 at the general locations for side intrinsic base segments 96. See FIGS. 7D and 8B. The small circles in FIGS. 7.4 and 8B represent the approximate location of the mean depth of the implanted p-type dopant. The p-type implant energy is 30–150 KeV, typically 60 KeV. In cases where the upper edge of field oxide is in the shape of a "bird's beak", the implant energy is typically set at a value high enough to allow the p-type dopant to pass through part of the "bird's beak" and into the underlying silicon.

Figure 7E:
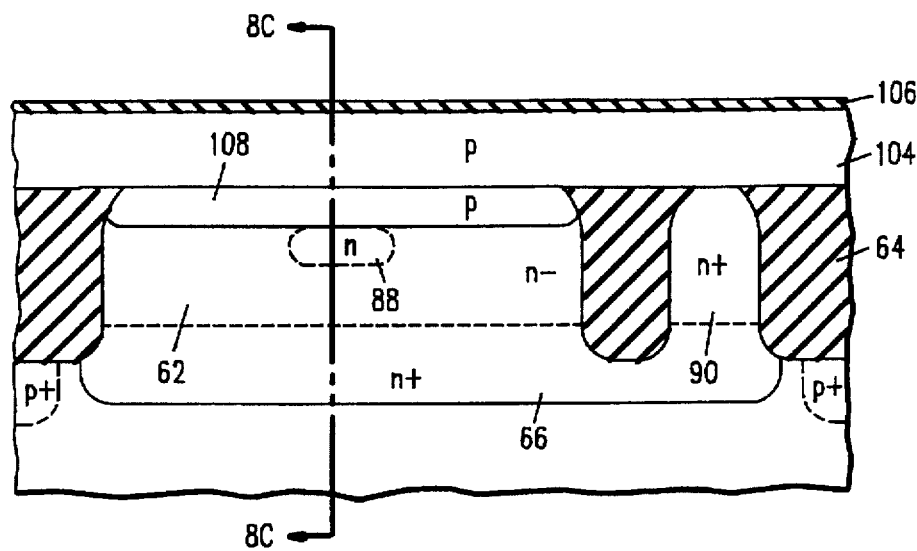
Figure 8C:
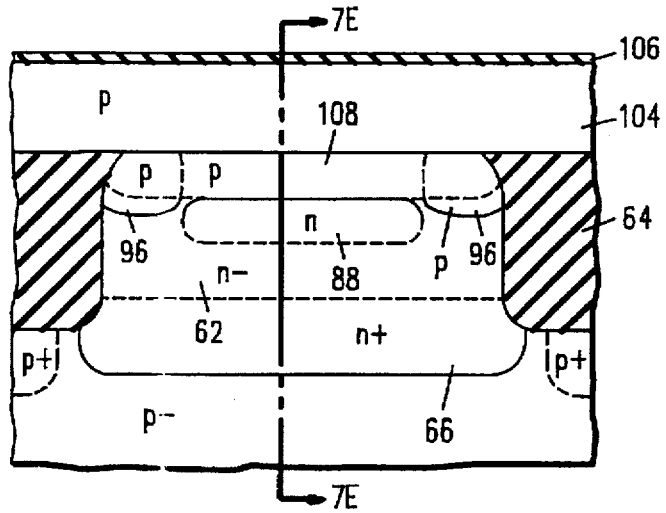

After removing photoresist 102, a polysilicon layer 104 is deposited on top of the structure as shown in FIGS. 7E and 8C. A thin electrically insulating layer 106, typically consisting of silicon oxide and overlying silicon nitride, is formed along the top of polysilicon layer 104. A p-type dopant is subsequently ion implanted through insulating layer 106 at a moderate dosage to conductively dope polysilicon layer 104.

An anneal is performed to activate the n-type and p-type dopants introduced into epitaxial layer 62. Special collector zone 88 and side intrinsic base segments 96 are thereby created. During the anneal, part of the p-type dopant in polysilicon layer 104 diffuses into epitaxial layer 62 to form a moderately doped p-type intrinsic base layer 108 in the left-hand semiconductor device region. The n-type doping in collector contact zone 90 is sufficiently high that contact zone 90 is not significantly affected by any of the p-type dopant entering contact zone 90 from polysilicon 104.

Figure 7F:
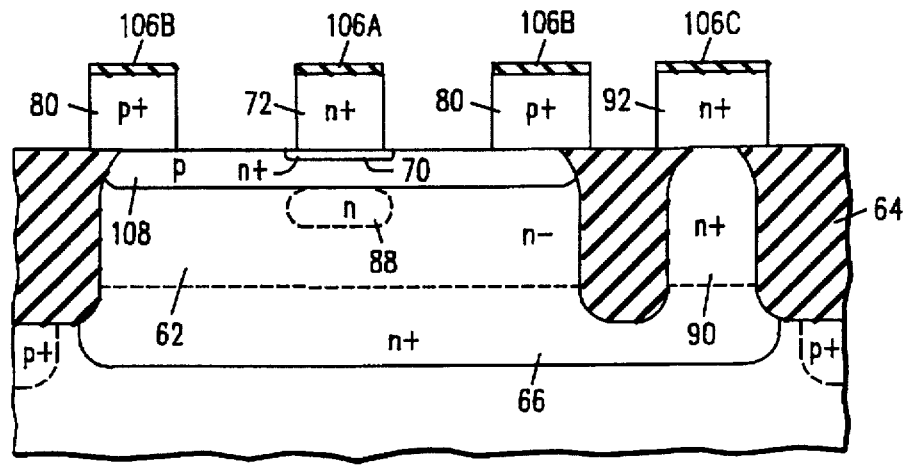
Figure 7G:
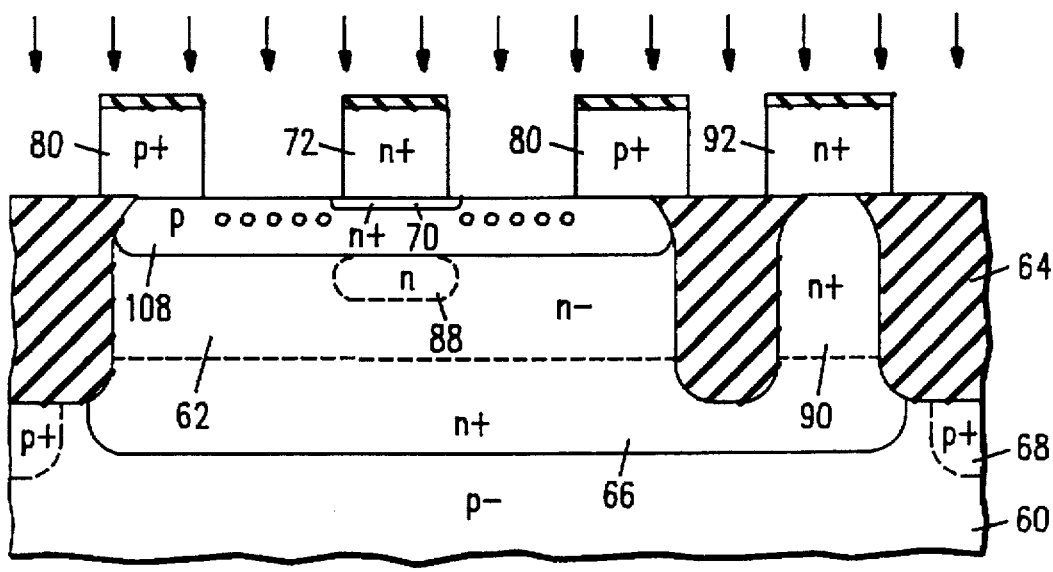
Figure 7H:
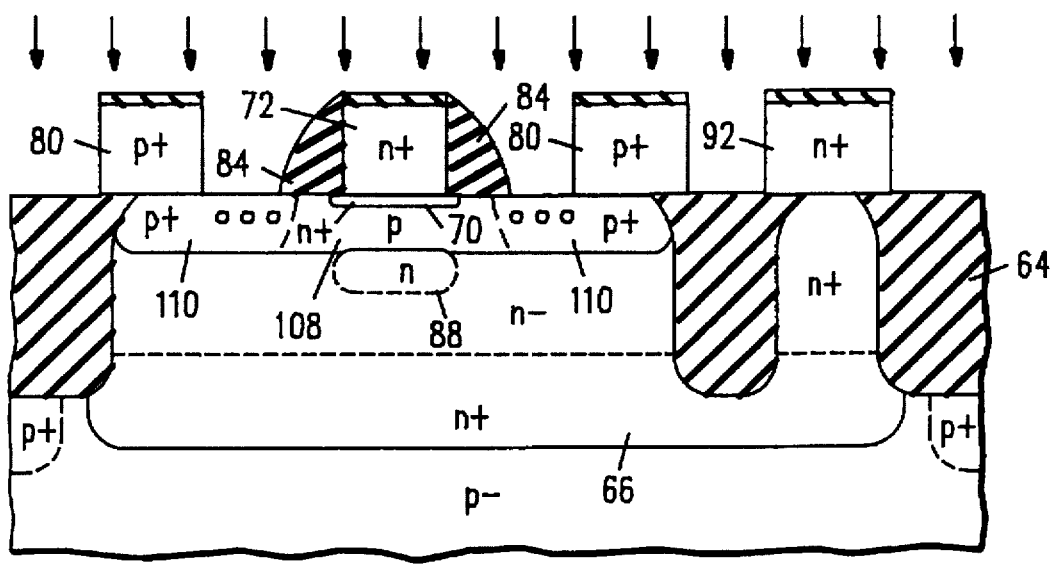

Using a photoresist mask (not shown), an n-type dopant is ion implanted at a high dosage through insulating layer 106 into polysilicon layer 104 generally at the locations for emitter contact 72 and collector contact 92. A p-type dopant is similarly ion implanted at a high dosage through insulating layer 106 into polysilicon layer 104 generally at the location for base contact 80 using another photoresist mask (also not shown). An anneal is performed to distribute the dopant within polysilicon layer 104. During the anneal, part of the n-type dopant in layer 104 diffuses downward to form a precursor to emitter 70 as shown in FIG. 7F. Part of the p-type dopant in layer 104 also downdiffuses into base layer 108.

Layers 104 and 106 are selectively etched using a photoresist mask (not shown) to generally define polysilicon contacts 72, 80, and 92. Items 106A, 106B, and 106C in FIG. 7F indicate the remaining portions of insulating layers 106 overlying contacts 72, 80, and 92. During the etch, a small thickness (not shown) of the monocrystalline silicon at the exposed areas is removed. Using polysilicon contacts 72, 80, and 92 as an implantation shield, a p-type dopant is ion implanted into the left-hand device region in FIG. 7G to provide a pair of links from the intrinsic base to later-formed base contact zones 78. The small circles in FIG. 7G indicate the approximate location of the mean depth of the base-link implant.

An anneal that activates the base-link dopant is performed. A layer of low-temperature oxide is deposited on top of the structure and isotropically etched to form oxide spacers 84 along the sidewalls of polysilicon emitter contact 72. See FIG. 7A. Oxide spacers that simultaneously form along the sidewalls of base contacts 80 are removed using a masked etching technique, typically along with oxide spacers formed along the sidewalls of collector contact 92.

Using contacts 72, 80, and 92 and oxide spacers 84 as an implantation shield, a p-type dopant is ion implanted into the left-hand device region in FIG. 7.8 at the general locations for parts of base contact zone 78. The structure is subsequently annealed to activate the just-implanted dopant and drive it outward. Part of the p-type dopant in base contacts 80 also downdiffuses. Base contact zones 78 are thereby formed along with base layer 76. Emitter 70, special collector zone 88, and side intrinsic base segments 96 expand to their final positions as shown in FIGS. 5a and 5b.

Metal silicide caps 74, 82, and 94 are provided in a conventional manner by depositing a layer of a suitable metal such as titanium on the top of the structure and heating the structure to convert part of the metal into caps 74, 82, and 94. The unreacted metal is removed to produce the structure of FIGS. 5–6.

The process of FIGS. 7 and 8 can be modified in various ways. For example, p base layer 108 could be formed by ion implantation rather than outdiffusion from polysilicon layer 104. The implantation steps shown in FIGS. 7.3, 7.4, 7.7, and 7.8 could be performed in a different order. One or more of the early anneals could be deleted.

Computer simulations have been performed to analyze the transistors of the invention. One-dimensional simulations were initially done with the Supreme-3 and Medici simulation programs available from Technology Modeling Associates to evaluate the effect of providing a BiCMOS process of the type generally described in Ilderem et al. cited above, with a non-optimized collector implant along the collector-base junction. In particular, an additional collector ion implantation was performed through the entire emitter area. The n-well implant available in the simulated BiCMOS process was used to implement the additional collector implant.

Figure 9:
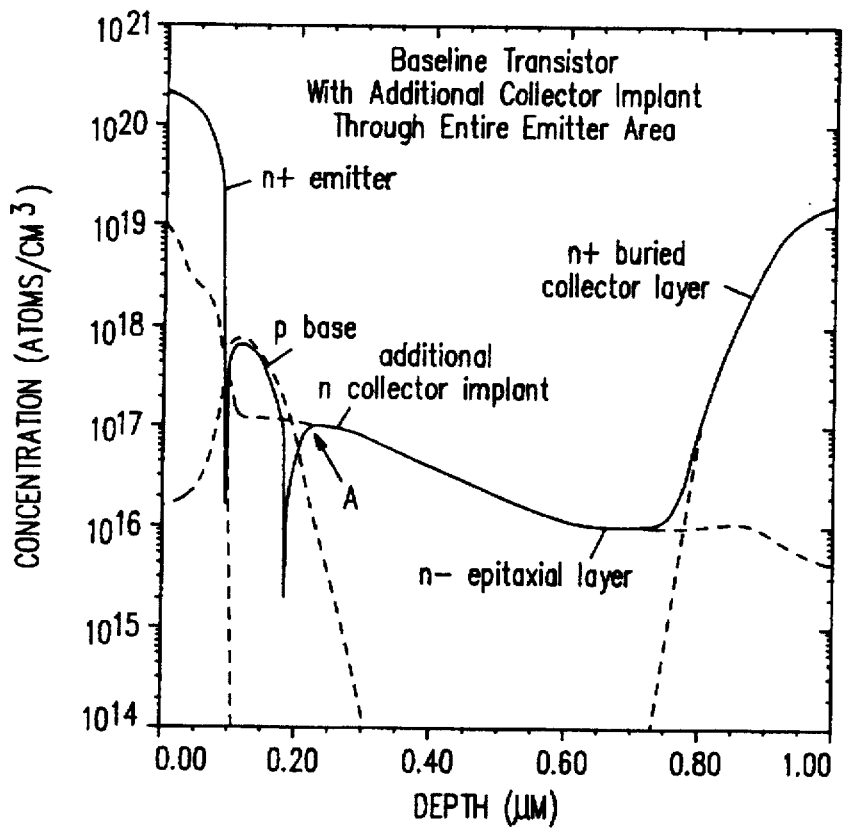
FIGS. 9 and 10 are graphs for dopant concentration as a function of depth for computer simulations of two baseline transistors.
Figure 10:
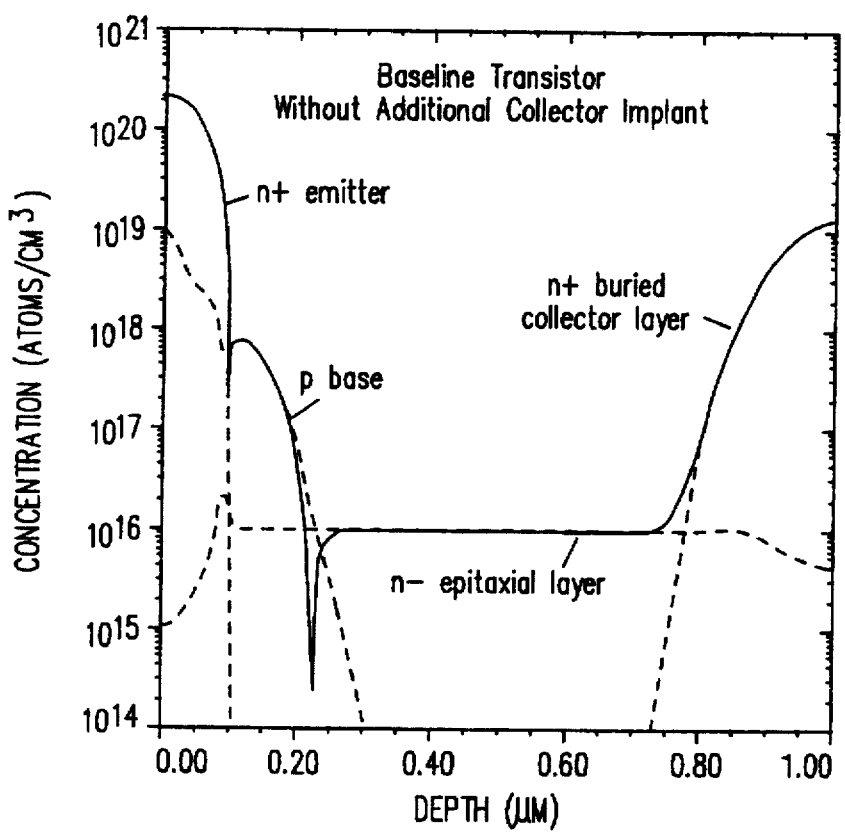

FIG. 9 illustrates dopant concentration for a simulated walled-emitter vertical baseline npn transistor having an additional collector implant provided through the entire emitter area. Arrow A in FIG. 9 indicates the rise in collector dopant concentration, approximately a seven-fold increase, caused by the additional collector implant. FIG. 10 illustrates dopant concentration for another simulated walled-emitter vertical baseline npn transistor configured in the same way as that of FIG. 9 except that the additional collector implant was not used. The values of all the other parameters in the two one-dimensional simulations were the same. Comparison of the baseline transistors in FIGS. 9 and 10 shows how the increased collector doping in the transistor of FIG. 9 caused its base to become thinner.

Profile and performance parameters for the baseline transistors simulated in FIGS. 9 and 10 are given below:

| Parameter | FIG. 9 | FIG. 10 |
|---|---|---|
| Emitter-base junction depth | 0.09 µm | 0.09 µm |
| Collector-base depth | 0.19 µm | 0.24 µm |
| Base thickness $t_B$ | 0.10 µm | 0.15 µm |
| Base Gummel number | $1.0 \times 10^{15}$ atoms/cm$^3$ | $2.5 \times 10^{15}$ atoms/cm$^3$ |
| Base sheet resistance | 36 Kohms/sq. | 12 Kohms/sq. |
| Current gain | 170 | 80 |
| Cutoff frequency $f_T$ | 25 | 18 |

Performing the additional ion implant through the entire emitter area caused the overall transistor current gain to double and cutoff frequency $f_T$ to increase approximately 40%. This performance gain is large enough to allow the additional collector implant to be confined to the central region of the transistor in order to improve the breakdown voltage and leakage current characteristics in accordance with the invention. Also, there is room for improving other parameters, such as base sheet resistance, that are degraded by the additional collector implant.

Full two-dimensional computer simulations were performed on various walled-emitter vertical npn transistor structures to compare the transistors of the invention with baseline transistors that lacked the selective dopings of the invention. The baseline transistors were basically two-dimensional variations of the walled-emitter baseline npn transistor in FIG. 10. The doping and isolation profiles were simulated with the TSupreme-4 two-dimensional process simulation program available from Technology Modeling Associates. The electrical characteristics were generated with the Medici two-dimensional semiconductor device simulation program also available from Technology Modeling Associates.

As with the one-dimensional simulations, the two-dimensional simulations utilized a BiCMOS process flow of the type described in Ilderem et al. The non-walled special collector implant of the invention was implemented with the standard n-well mask and dose of the simulated BiCMOS process. The additional base dopant at the emitter termination regions along the sidewalls of the oxide-isolation region was implemented with the threshold-voltage mask and implant using a modified implant dose.

FIGS. 11–14 represent half-device longitudinal profiles of the following four transistors examined during the two-dimensional simulations:

(a) an inventive npn transistor having generally vertical isolation-oxide sidewalls and containing special collector zone 88 of the transistor of FIGS. 3–4 in combination with an approximate 10% greater base doping than transistor (b), the increased base doping being achieved by causing approximately 10% more of the base dopant to diffuse from the overlying doped polysilicon into the base layer than in transistor (b), (b) a walled-emitter baseline npn transistor having generally vertical isolation-oxide sidewalls but lacking special collector zone 88, (c) an inventive npn transistor having slanted isolation-oxide sidewalls and containing special collector zone 88 and side intrinsic base segments 96 of the transistor in FIGS. 5–6, and (d) a walled-emitter baseline npn transistor having slanted isolation-oxide sidewalls but lacking special collector zone 88 and side intrinsic base segments 96.

Figure 11:
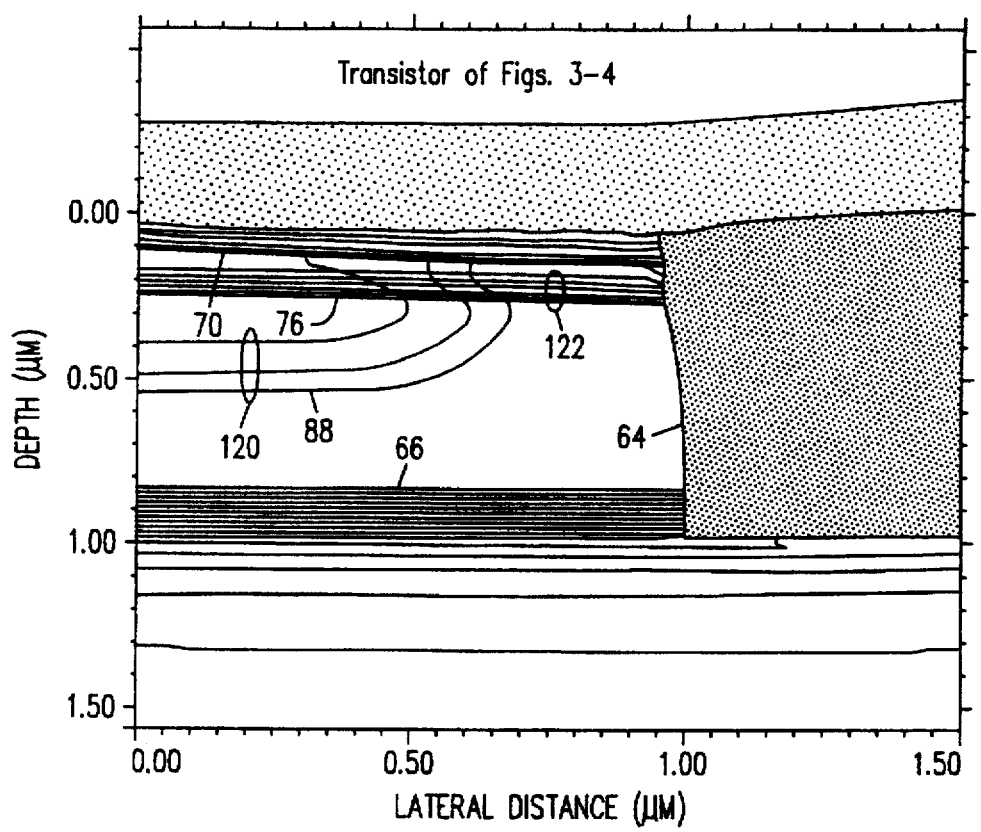
FIGS. 11 and 12 are profile graphs illustrating lines of constant net dopant concentration for computer simulations of the transistor in FIGS. 3a and 3b and a baseline transistor for the case in which the sidewalls of the field-isolation regions are largely vertical.
Figure 12:
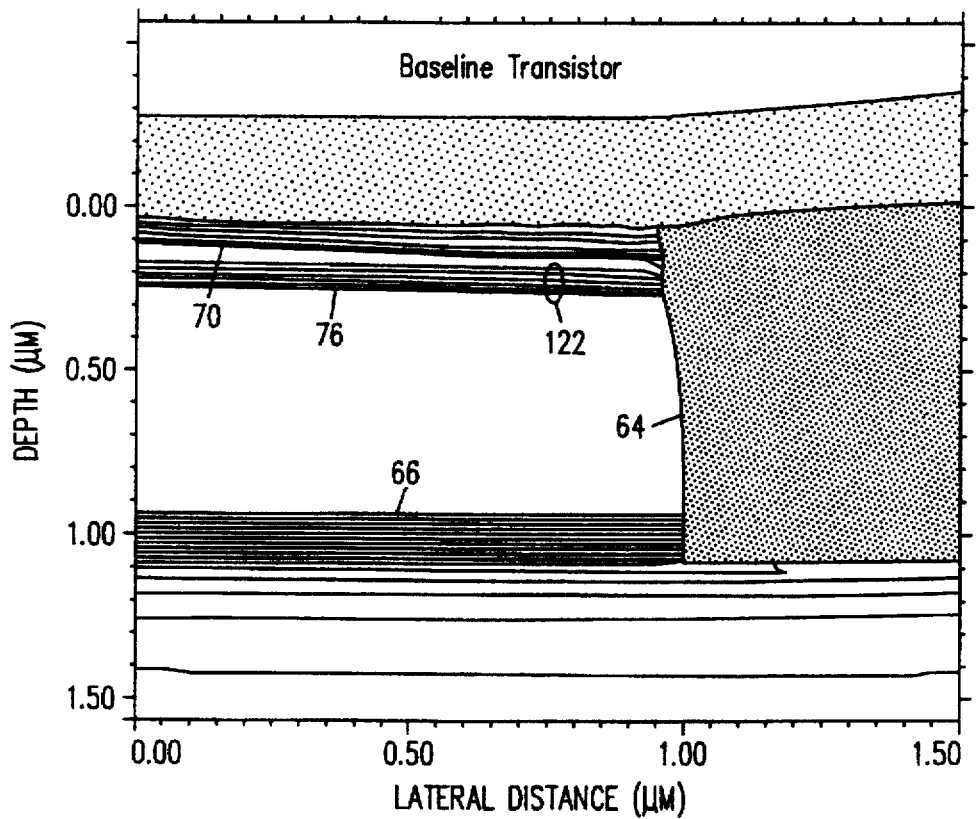
Figure 13:
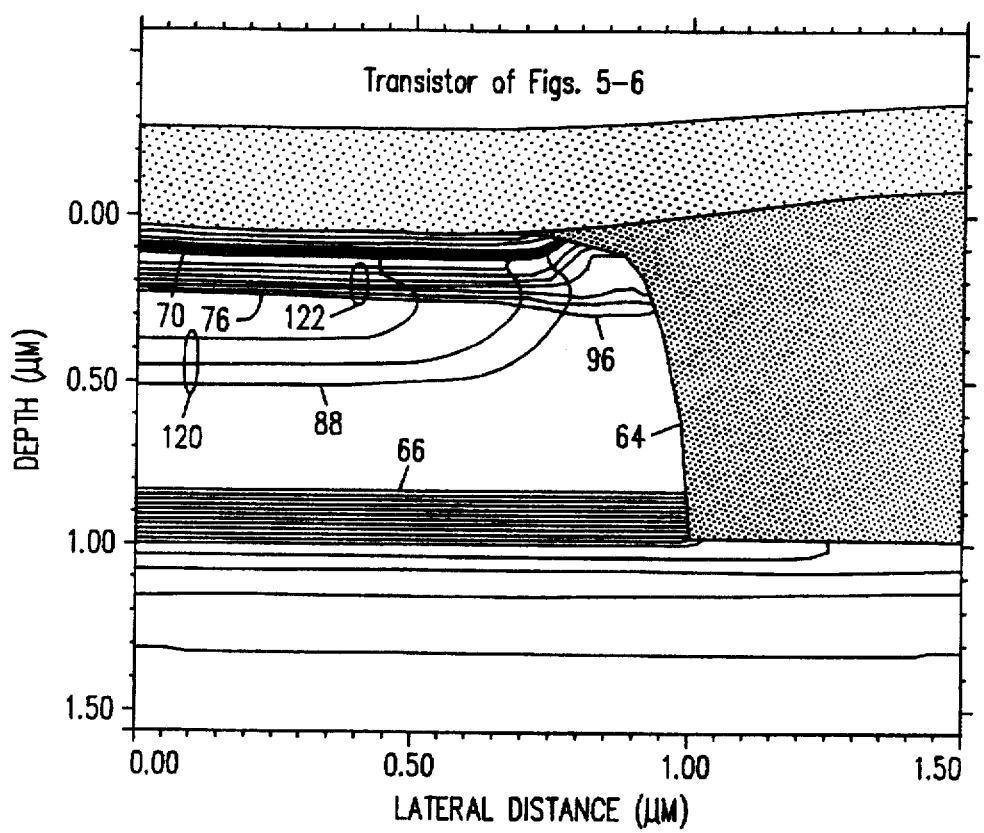
FIGS. 13 and 14 are profile graphs for lines of constant net dopant concentration for computer simulations of the transistor in FIGS. 5a and 5b and a baseline transistor for the case in which the sidewalls of the field-isolation regions are in the "bird's beak" shape.
Figure 14:
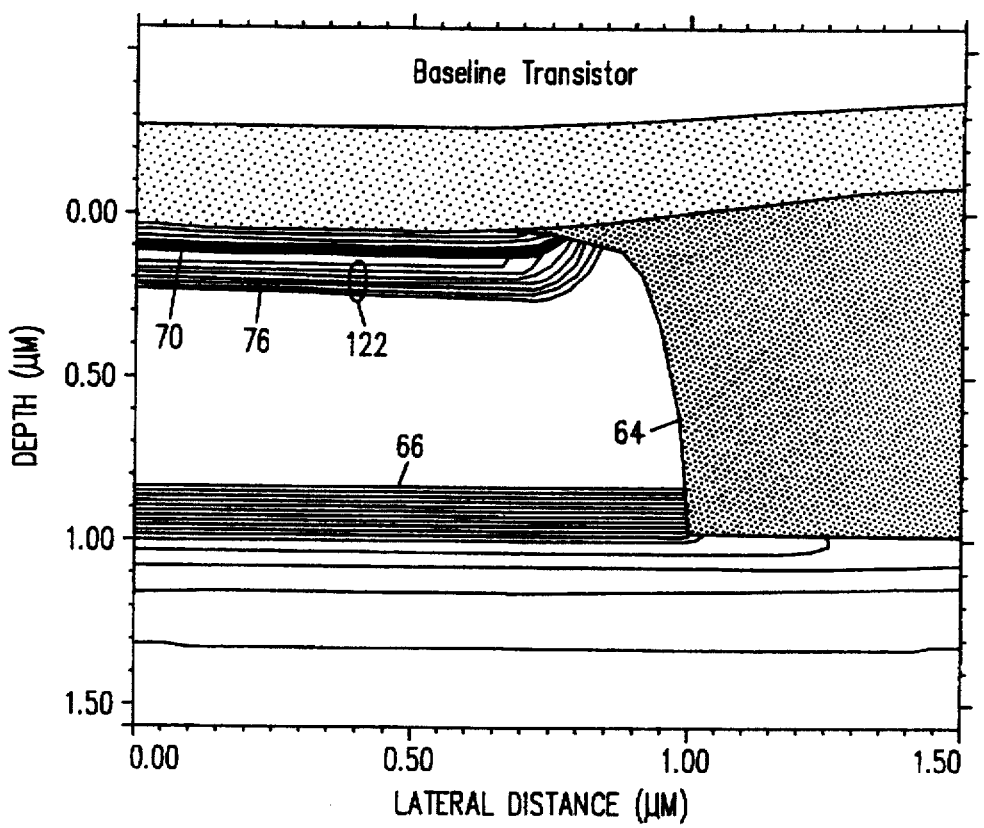
Figure 15:
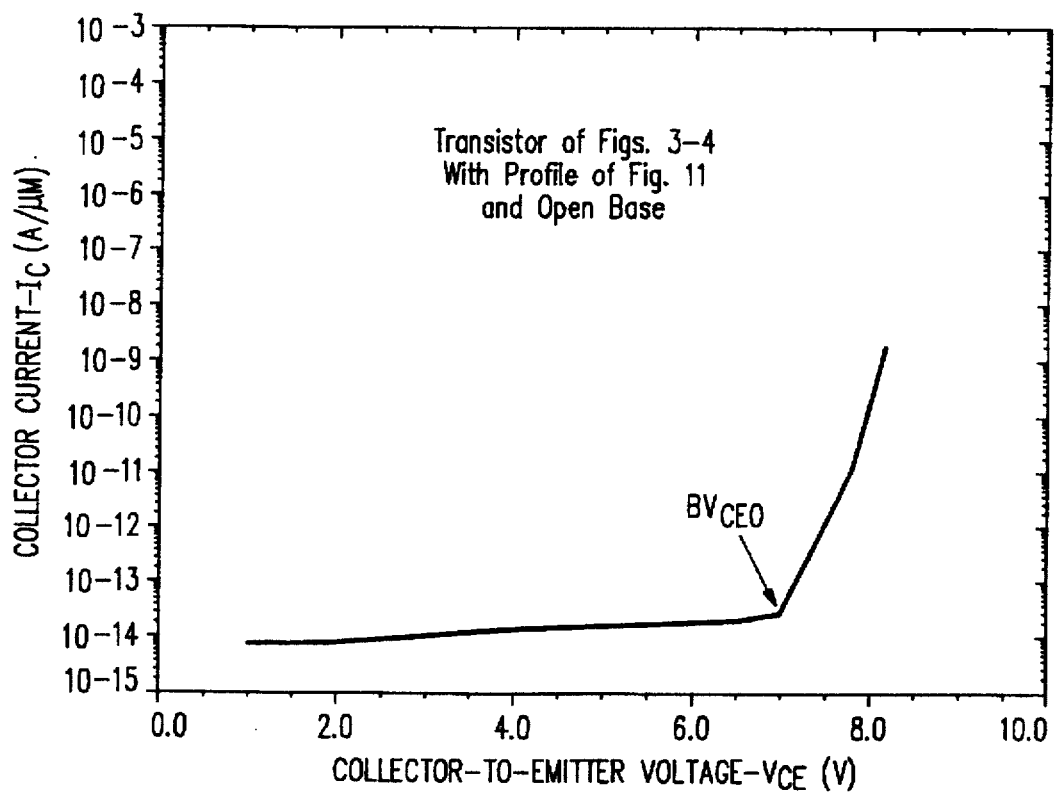
FIGS. 15 and 16 are graphs for linear open-base collector current as a function of collector-to-emitter voltage for computer simulations of transistors respectively having the profiles of FIGS. 11 and 12.
Figure 16:
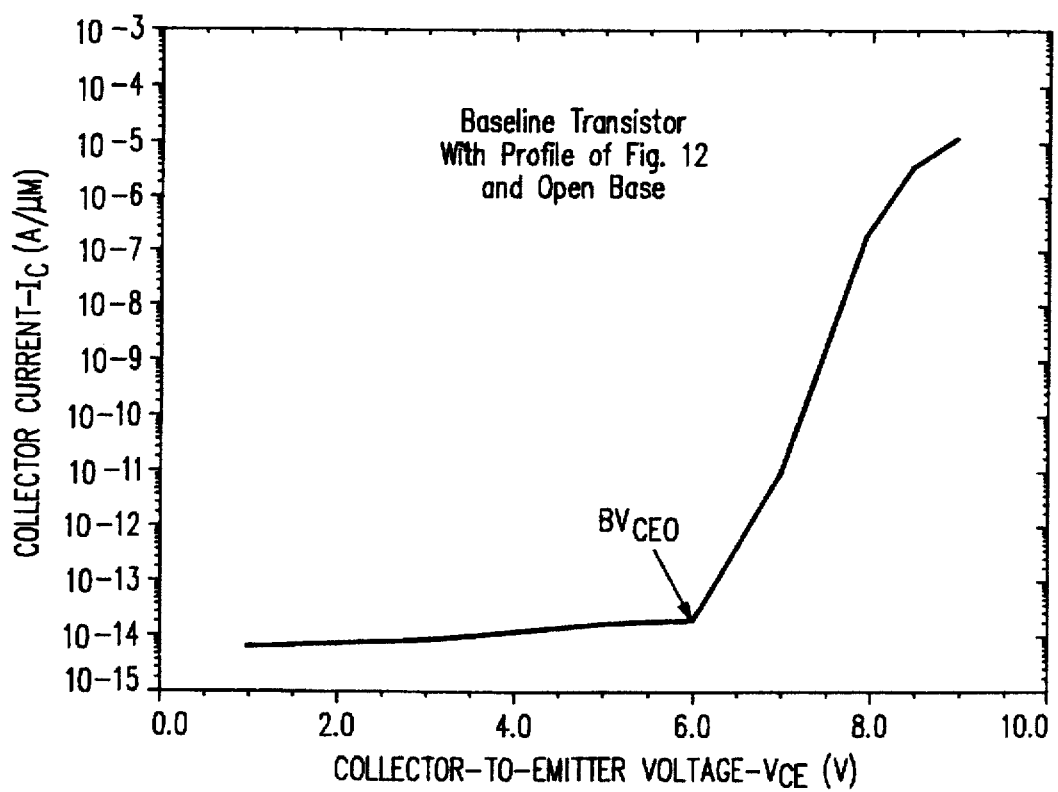

For convenience, the reference symbols used in FIGS. 3–4 and 5–6 have been applied to the baseline transistors of FIGS. 12 and 14 as well as the inventive transistors of FIGS. 11 and 13. Sub-surface contour lines 120 that start from the left-hand side in FIGS. 11 and 13 represent contours of constant donor concentration for the special collector implant.

Contour lines 122 that start from the left-hand sides in FIGS. 11–14 near the upper surfaces represent contours of constant acceptor concentration in the base regions. In FIGS. 11 and 12 where the oxide-isolation sidewalls extend nearly vertically, base contour lines 122 compress slightly near the isolation regions. This means that the base dopant concentration and the base thickness $t_B$ are both reduced slightly along the isolation sidewalls, thereby indicating sites that may determine the values of parameters $BV_{CEO}$ and $I_{CEO}$.

In the baseline transistor of FIG. 14 where the sidewalls of the field oxide are highly slanted, base contour lines 122 converge even more drastically as they approach the oxide-isolation sidewalls. The base dopant concentration and base thickness $t_B$ along the sidewalls are greatly reduced, indicating a substantial lowering of breakdown voltage $BV_{CEO}$ and a substantial increase in leakage current $I_{CEO}$. Conversely, base contour lines 122 in FIG. 13, where the transistor includes side intrinsic base segments 96, expand near the sidewalls of oxide-isolation region 64. The likelihood of breakdown premature avalanching or punch-through along the oxide sidewalls is low. Comparison of FIGS. 13 and 14 thus indicates that the presence of segments 96 should substantially improve the breakdown voltage and leakage current characteristics.

FIGS. 15–18 confirm the qualitative conclusions drawn from FIGS. 11–14. FIGS. 15–18 respectively illustrate simulated output current-voltage ("I–V") characteristics for the transistor profiles of FIGS. 11–14. Comparison of FIGS. 15 and 16 indicates that the inventive transistor of FIG. 15, whose base doping is approximately 10% greater than that of the baseline transistor of FIG. 16 as a result of the additional base doping margin created by the presence of special collector zone 88, has approximately 1 volt more of breakdown voltage $BV_{CEO}$ then the transistor of FIG. 16.

Figure 17:
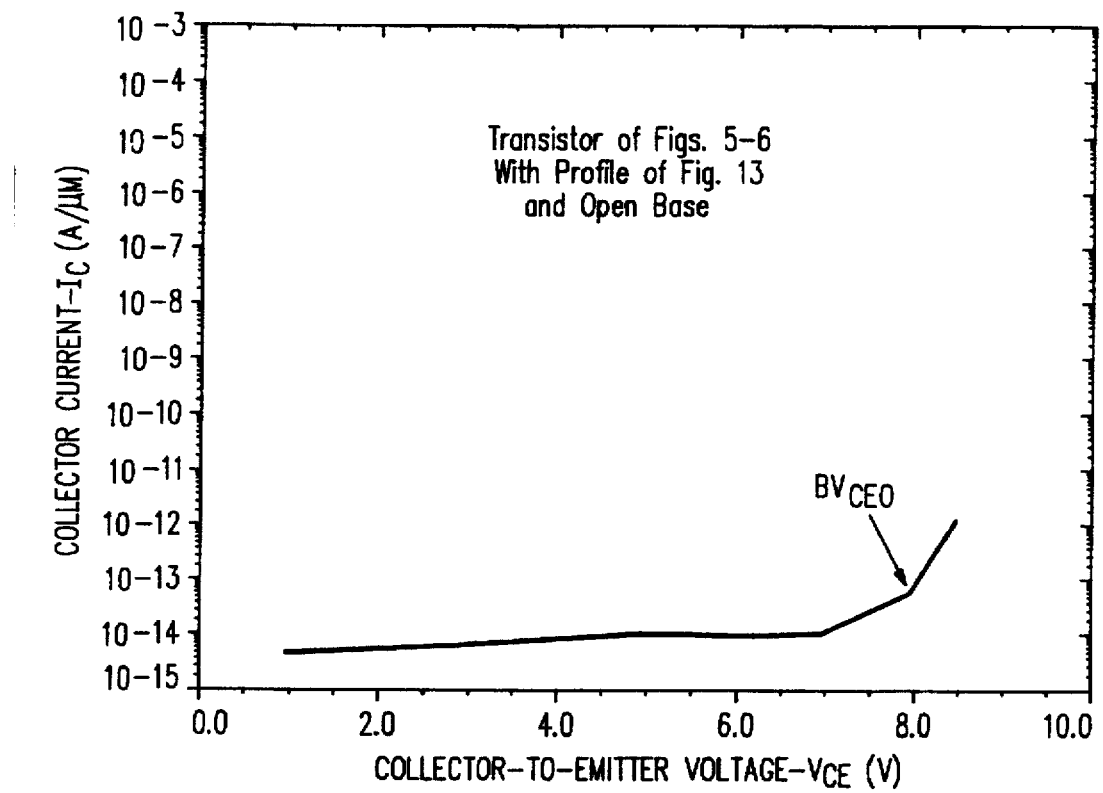
FIGS. 17 and 18 are graphs for linear open-base collector current as a function of collector-to-emitter voltage for computer simulations of transistors respectively having the profiles of FIGS. 13 and 14.
Figure 18:
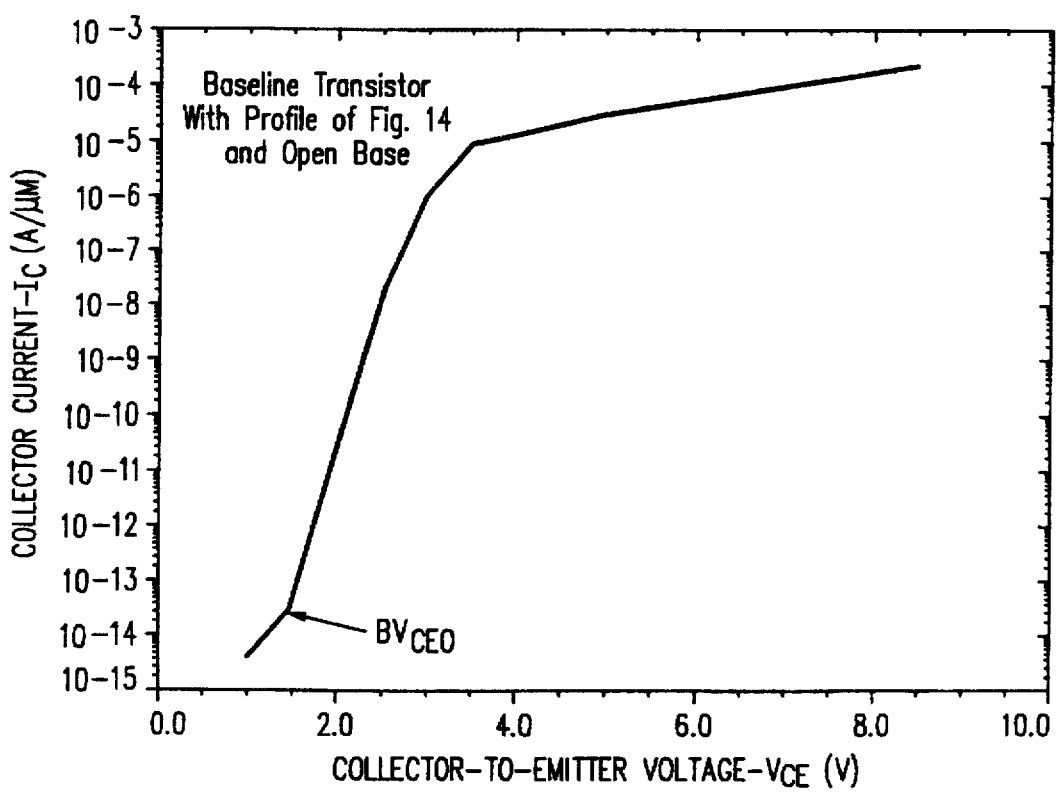

As indicated in FIG. 17, breakdown voltage $BV_{CEO}$ is even higher when both the special collector implant and the additional base implant are utilized. Breakdown voltage $BV_{CEO}$ is now approximately 8 volts. Furthermore, the slope of the I-V curve in FIG. 17 is considerably reduced so as to permit near-breakdown operation up to a $V_{CE}$ value near 9 volts. On the other hand, FIG. 18 shows that the value of breakdown voltage $BV_{CEO}$ for the baseline transistor having the profile of FIG. 14 is an unacceptably low 1.5 volts. The net result is that combining the special collector implant with the additional base implant provides a large increase in breakdown voltage $BV_{CEO}$, especially when the isolation-oxide sidewalls are steeply sloped.

While the invention has been described with reference to particular embodiments, this description is solely for the purpose of illustration and is not to be construed as limiting the scope of the invention claimed below. For example, the additional base implant could be performed through only one end of the emitter finger; the improvement in leakage current would be approximately half that described above. Similarly, one longitudinal end of special collector zone 88 could adjoin field oxide 64 while the other longitudinal end of collector zone 88 is spaced apart from field oxide 64.

Transverse dimensions could exceed longitudinal dimensions. Semiconductor materials of opposite conductivity types to those described above may be employed to achieve substantially the same results. That is, a vertical pnp transistor could be provided with regions analogous to special collector zone 88 and side intrinsic base segments 96. The ion-implantation steps utilized in fabricating the pnp transistor would typically be performed in a different order from that described above.

Field-isolation structures such as standard (i.e., partially sunk but not recessed) LOCOS, SWAMI, and trench isolation could be used in place of recessed field oxide 64. Various modifications and applications may thus be made by those skilled in the art without departing from the true scope and spirit of the invention as defined in the appended claims.

We claim:

1. A method which comprises the following steps for manufacturing a bipolar transistor from a semiconductor body provided with a patterned electrically insulating field-isolation region sunk into the body along its upper surface so as to laterally surround a semiconductor device region:

introducing primary base dopant into the device region to define a base layer that adjoins the field-isolation region;

selectively introducing emitter dopant generally shallower into the device region than the primary dopant to define an emitter in part of the base layer such that the emitter also adjoins the field-isolation region; and selectively introducing collector dopant generally deeper into the device region than the primary dopant to define a special collector zone fully laterally separated from the field-isolation region such that, at the end of the three dopant introducing steps, an intrinsic base portion of the device region directly underlies the emitter and overlies the special collector zone.

2. A method as in claim 1 wherein the transistor has (a) a collector comprising the special collector zone and material of the semiconductor body underlying the special collector zone and (b) a base comprising material of the base layer outside the emitter and the special collector zone.

3. A method as in claim 1 wherein the field-isolation region consists primarily of oxidized semiconductor material.

4. A method as in claim 1 wherein (a) the emitter and collector dopants are of a first conductivity type and (b) the base dopant is of a second conductivity type opposite to the first conductivity type.

5. A method as in claim 1 wherein the collector dopant is ion implanted into the device region.

6. A method as in claim 5 wherein the collector dopant introducing step is initiated before at least one of the other dopant introducing steps.

7. A method as in claim 1 further including the step of selectively introducing additional base dopant into the device region through a pair of laterally separated upper surface portions that overlie corresponding parts of the intrinsic base portion and extend laterally to the field-isolation region to define a pair of laterally separated side intrinsic base segments of the intrinsic base portion, largely all of each side intrinsic base segment underlying the emitter.

8. A method as in claim 7 wherein the collector and additional dopants are introduced into the device region sufficiently close to each other that the side intrinsic base segments adjoin the special collector zone.

9. A method as in claim 7 wherein the additional base dopant is ion implanted into the device region.

10. A method as in claim 7 further including the step of selectively introducing further base dopant into the device region through an upper surface portion spaced laterally apart from the emitter and the intrinsic base portion to define a base contact zone having a greater net doping than the intrinsic base portion, the steps of introducing the additional and further base dopants to define the side intrinsic base portions and the base contact zone being separately initiated.

11. A method as in claim 7 wherein the field-isolation region has a pair of laterally separated opposing sidewalls that adjoin the emitter and the side intrinsic base segments.

12. A method as in claim 11 wherein the sidewalls of the field-isolation region have profiles generally in the shape of birds' beaks, part of the additional base dopant being implanted through the birds' beaks into the device region.

13. A method as in claim 7 wherein more of the primary base dopant is introduced into the device region to define the base layer than what would occur in the absence of the special collector zone while the unity-gain transistor cutoff frequency is greater than what would occur in the absence of the special collector zone.

14. A method which comprises the following steps for manufacturing a bipolar transistor from a semiconductor body provided with a patterned electrically insulating field-isolation region sunk into the semiconductor body along its upper surface so as to laterally surround a semiconductor device region:

introducing primary base dopant into the device region to define a base layer;

selectively introducing emitter dopant generally shallower into the device region than the primary dopant to define an emitter in part of the base layer;

selectively introducing further base dopant into the device region through an upper surface portion spaced laterally apart from the emitter to define a base contact zone having a greater net doping than an intrinsic base portion directly underlying the emitter; and selectively separately introducing additional base dopant into the device region through an upper surface portion that overlies part of the intrinsic base portion and extends laterally to the field-isolation region to define a side intrinsic base segment of the intrinsic base portion, largely all of the side intrinsic base sequent underlying the emitter.

15. A method as in claim 14 wherein the last-mentioned introducing step includes introducing the additional dopant of the second conductivity type into the device region through another upper surface portion that overlies part of the intrinsic base portion and extends to the field-isolation region to define another side intrinsic base segment of the intrinsic base portion such that the two side intrinsic base segments are laterally separated.

16. A method as in claim 15 wherein the additional base dopant is ion implanted into the device region.

17. A method as in claim 16 wherein the field isolation region consists primarily of oxidized semiconductor material.

18. A method as in claim 15 wherein the side intrinsic base segments extend deeper into the device region than material of the intrinsic base portion outside the side intrinsic base segments.

19. A method as in claim 15 wherein the field-isolation region has a pair of laterally separated opposing sidewalls that adjoin the emitter and the side intrinsic base segments.

20. A method as in claim 19 wherein the sidewalls of the field-isolation region have profiles generally in the shape of birds' beaks, part of the additional base dopant being implanted through the birds' beaks into the device region.

21. A method as in claim 14 wherein (a) the emitter dopant is of a first conductivity type and (b) the base dopants are of a second conductivity type opposite to the first conductivity type.

22. A method as in claim 14 wherein the side intrinsic base segment extends deeper into the device region than material of the intrinsic base portion outside the side intrinsic base segment.

23. A method as in claim 14 wherein the field-isolation region has a pair of laterally separated opposing sidewalls that adjoin the emitter, a specified one of the sidewalls also adjoining the side intrinsic base segment.

24. A method as in claim 23 wherein the sidewalls of the field-isolation region have profiles generally in the shape of birds' beaks, part of the additional base dopant being implanted through the bird's beak of the specified sidewall into the device region.

* * * * *